US006413843B1

(12) United States Patent
Hara

(10) Patent No.: US 6,413,843 B1
(45) Date of Patent: Jul. 2, 2002

(54) METHOD OF FORMING A SEMICONDUCTOR MEMORY DEVICE HAVING SOURCE/DRAIN DIFFUSION LAYERS WITH A REDUCED RESISTANCE

(75) Inventor: Hideki Hara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/487,989

(22) Filed: Jan. 20, 2000

(30) Foreign Application Priority Data

Jan. 20, 1999 (JP) .......................................... 11-012541

(51) Int. Cl.⁷ ...................... H01L 27/115; H01L 21/336
(52) U.S. Cl. ........................................ 438/525; 438/262
(58) Field of Search ........................... 438/525–27, 588, 438/593, 595, 201, 211, 257–529, 262

(56) References Cited

U.S. PATENT DOCUMENTS

| 5,087,584 A | * | 2/1992 | Wada et al. | 438/262 |
| 5,278,438 A | * | 1/1994 | Kim et al. | 257/316 |
| 5,736,442 A | * | 4/1998 | Mori | 438/257 |
| 5,795,801 A | * | 8/1998 | Lee | 438/525 |
| 5,989,959 A | * | 11/1999 | Araki | 438/258 |
| 5,998,267 A | * | 12/1999 | Bergemont et al. | 438/270 |
| 6,037,247 A | * | 3/2000 | Anand | 438/618 |
| 6,103,574 A | * | 8/2000 | Iwasaki | 438/257 |
| 6,228,715 B1 | * | 5/2001 | Shimoji | 438/264 |
| 6,268,248 B1 | * | 7/2001 | Mehrad | 438/262 |

FOREIGN PATENT DOCUMENTS

| JP | 05-343693 A | * | 12/1993 | H01L/29/788 |
| JP | 09-082924 A | * | 3/1997 | H01L/27/115 |

OTHER PUBLICATIONS

Y. Ohshima et al., Process and Device Technologies for 16Mbit EPROMs with Large–Tilt–Angle Implanted P–Pocket Cell. IEEE 1990, pp. 95–98.*
J.D. Bude et al., Secondary Electron Flash—a High Performance Low Power Flash Technology for 0.35 Micron and below, 1997 IEEE, pp. 279–282.*
R. Kazerounian et al., Alternat Metal Virtual Ground (AMG)—a New Scaling Concept for Very High–Density EPROM's. 1991 IEEE, pp. 450–452.*
Min–hwa Chi et al., Programming and Era with Floating–Body for High–Density Low Voltage Flash EEPROM Fabricated on SOI Waffers. 1995 IEEE, pp. 129–130.*

* cited by examiner

Primary Examiner—Olik Chaudhuri
Assistant Examiner—Anh Duy Mai
(74) Attorney, Agent, or Firm—McGinn & Gibb, PLLC

(57) ABSTRACT

The present invention provides a method of forming a diffusion layer which extends on bottoms and side walls of trench grooves as well as on top portions of ridged portions separating the trench grooves, and the trench grooves being separated by ridged portions of the substrate so that the trench grooves and the ridged portions are aligned between adjacent two of gate electrode structures, the method comprising the steps of: carrying out a first ion-implantation in a vertical direction to introduce an impurity into the bottoms of the trench grooves and into top portions of the ridged portions by use of gate electrode structures; forming side wall insulation films on side wails of the gate electrode structures; and carrying out a second ion-implantation in an oblique direction with a rotation of the substrate by use of the gate electrode structures and the side walls.

11 Claims, 44 Drawing Sheets

METHOD OF FORMING A SEMICONDUCTOR MEMORY DEVICE HAVING SOURCE/DRAIN DIFFUSION LAYERS WITH A REDUCED RESISTANCE

BACKGROUND OF THE INVENTION

The present invention relates to a method of forming a semiconductor memory device, and more particularly to a method of forming a semiconductor memory device such as a flash memory having source/drain diffusion layers with a reduced resistance.

The semiconductor memory device such as a flash memory has been subjected to the requirement for shrinkage of cell. In order to scale down the cell, a source diffusion layer is formed by self-alignment technique using a gate electrode as a mask. This self-aligned source technique is disclosed in Japanese patent publication No. 63-41224.

In recent years, a further scaling down of the cell has been on the requirement. Under this circumstances, a trench isolation technique has been attractive for scaling down the isolation to the diffusion layers. A conventional method of forming a semiconductor memory device having a trench isolation structure will be described.

FIG. 1A is a fragmentary plane view illustrative of a semiconductor memory device having a trench isolation structure in a first step involved in a conventional fabrication method. FIG. 1B is a fragmentary cross sectional elevation view illustrative of a semiconductor memory device having a trench isolation structure in a first step involved in a conventional fabrication method, taken along a I—I line of FIG. 1A. FIG. 1C is a fragmentary cross sectional elevation view illustrative of a semiconductor memory device having a trench isolation structure in a first step involved in a conventional fabrication method, taken along an II—II line of FIG. 1A. FIG. 1D is a fragmentary cross sectional elevation view illustrative of a semiconductor memory device having a trench isolation structure in a first step involved in a conventional fabrication method, taken along an III—III line of FIG. 1A.

With reference to FIGS. 1A, 1B, 1C and 1D, a trench isolation technique is used to form a plurality of trench isolations 102 in a semiconductor substrate 100 thereby to define a plurality of diffusion layers 101 in the semiconductor substrate 100, wherein each of the diffusion layers 101 are defined between the adjacent two of the trench isolations 102. The trench isolations 102 have a stripe shape in plane view and a trench shape in sectional view. The trench isolations 102 extend in a first horizontal direction and in parallel to each other at a constant pitch.

FIG. 2A is a fragmentary plane view illustrative of a semiconductor memory device having a trench isolation structure in a second step involved in a conventional fabrication method. FIG. 2B is a fragmentary cross sectional elevation view illustrative of a semiconductor memory device having a trench isolation structure in a second step involved in a conventional fabrication method, taken along a I—I line of FIG. 2A. FIG. 2C is a fragmentary cross sectional elevation view illustrative of a semiconductor memory device having a trench isolation structure in a second step involved in a conventional fabrication method, taken along an II—II line of FIG. 2A, FIG. 2D is a fragmentary cross sectional elevation view illustrative of a semiconductor memory device having a trench isolation structure in a second step involved in a conventional fabrication method, taken along an III—III line of FIG. 2A.

A gate insulation film is formed over surfaces of the diffusion layers 101. A floating gate electrode layer 104 is then formed on the gate insulation film. Laminations of the gate insulation film and the floating gate electrode layer are patterned to form gate insulation films 103 which cover the diffusion layers 101 and the floating gate electrodes 104 on the gate insulation films 103. The floating gate electrodes 104 extend in the first horizontal direction and in parallel to each other at the constant pitch.

FIG. 3A is a fragmentary plane view illustrative of a semiconductor memory device having a trench isolation structure in a third step involved in a conventional fabrication method. FIG. 3B is a fragmentary cross sectional elevation view illustrative of a semiconductor memory device having a trench isolation structure in a third step involved in a conventional fabrication method, taken along a I—I line of FIG. 3A. FIG. 3C is a fragmentary cross sectional elevation view illustrative of a semiconductor memory device having a trench isolation structure in a third step involved in a conventional fabrication method, taken along an II—II line of FIG. 3A. FIG. 3D is a fragmentary cross sectional elevation view illustrative of a semiconductor memory device having a trench isolation structure in a third step involved in a conventional fabrication method, taken along an III—III line of FIG. 3A.

An inter-layer insulator 105 is formed over the substrate 100, so that the inter-layer insulator 105 covers the floating gate electrodes 104, wherein the inter-layer insulator 105 comprises laminations of a silicon oxide film, a silicon nitride film and a silicon oxide film. Control gate electrodes 106 are formed over the substrate 100 so that the control gate electrodes 106 are stripe shaped and extend in a second direction perpendicular to the first direction along which the trench isolations 102 extend. The control gate electrodes 106 comprises laminations of a polysilicon layer 106a and a tungsten silicide layer 106b on the polysilicon layer 106a.

FIG. 4A is a fragmentary plane view illustrative of a semiconductor memory device having a trench isolation structure in a fourth step involved in a conventional fabrication method. FIG. 4B is a fragmentary cross sectional elevation view illustrative of a semiconductor memory device having a trench isolation structure in a fourth step involved in a conventional fabrication method, taken along a I—I line of FIG. 4A. FIG. 4C is a fragmentary cross sectional elevation view illustrative of a semiconductor memory device having a trench isolation structure in a fourth step involved in a conventional fabrication method, taken along an II—II line of FIG. 4A. FIG. 4D is a fragmentary cross sectional elevation view illustrative of a semiconductor memory device having a trench isolation structure in a fourth step involved in a conventional fabrication method, taken along an III—III line of FIG. 4A.

A photo-resist pattern 107 is selectively formed which has an opening which is positioned over a gap between the adjacent two of the control gate electrode 106 and also over confronting half sides of the adjacent two of the control gate electrode 106. The photo-resist pattern 107 and the control gate electrodes 106 are used as masks to carry out an etching to the trench isolations 102, so that trench grooves are formed. The photo-resist pattern 107 is removed.

FIG. 5A is a fragmentary plane view illustrative of a semiconductor memory device having a trench isolation structure in a fifth step involved in a conventional fabrication method. FIG. 5B is a fragmentary cross sectional elevation view illustrative of a semiconductor memory device having a trench isolation structure in a fifth step involved in a conventional fabrication method, taken along a I—I line of FIG. 5A FIG. 5C is a fragmentary cross sectional elevation view illustrative of a semiconductor memory device having a trench isolation structure in a fifth step involved in a conventional fabrication method, taken along an II—II line of FIG. 5A. FIG. 5D is a fragmentary cross sectional elevation view illustrative of a semiconductor memory device having a trench isolation structure in a fifth step involved in a conventional fabrication method, taken along an III—III line of FIG. 5A.

An ion-implantation of an impurity such as arsenic is carried out in a vertical direction to the surface of the substrate to form source diffusion layers 108 in upper regions of the diffusion regions 101. Etched portions of the isolations have a trench structure, for which reason it is difficult for the vertical ion-implantation to introduce the impurity such as arsenic to the side surfaces 101a of the trench structure, whereby an increase in resistance of the source diffusion layer 108 is caused. The increase in resistance of the source diffusion layer 108 deteriorates high speed performance of the cells of the flash memory, and speeds of writing and reading operations.

In the above circumstances, it had been required to develop a novel method of forming a semiconductor memory device free from the above problem.

SUMMARY OF THE INVENTION

Accordingly, it is an object of the present invention to provide a novel method of forming a semiconductor memory device free from the above problems.

It is a further object of the present invention to provide a novel method of forming a semiconductor memory device without increase in resistance of a source diffusion layer.

It is a still further object of the present invention to provide a novel method of forming a semiconductor memory device by introducing a sufficient amount of impurity into side surfaces of trench structures.

The present invention provides a method of forming a diffusion layer which extends on bottoms and side walls of trench grooves as well as on top portions of ridged portions separating the trench grooves, and the trench grooves being separated by ridged portions of the substrate so that the trench grooves and the ridged portions are aligned between adjacent two of gate electrode structures, the method comprising the steps of carrying out a first ion-implantation in a vertical direction to introduce an impurity into the bottoms of the trench grooves and into top portions of the ridged portions by use of gate electrode structures; forming side wall insulation films on side walls of the gate electrode structures; and carrying out a second ion-implantation in an oblique direction with a rotation of the substrate by use of the gate electrode structures and the side walls.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides a method of introducing an impurity into side walls of a trench groove formed in a substrate by carrying out an ion-implantation in an oblique direction with a rotation of the substrate.

The present invention also provides a method of introducing an impurity into side walls of trench grooves formed in a substrate, and the trench grooves being separated by ridged portions of the substrate so that the trench grooves and the ridged portions are aligned between adjacent two of gate electrode structures, wherein the method comprises the step of carrying out an ion-implantation in an oblique direction with a rotation of the substrate by use of the gate electrode structures as masks.

It is preferable that the gate electrode structures have side wall insulation films.

It is further preferable that the side wall insulation films on opposite side walls of each of the gate electrode structures have the same height.

It is also preferable that the side wall insulation films on opposite side walls of each of the gate electrode structures have different heights from each other.

It is also preferable that the gate electrode structure has a floating gate electrode and a control gate electrode.

The present invention provides a method of forming a diffusion layer which extends on bottoms and side walls of trench grooves as well as on top portions of ridged portions separating the trench grooves, and the trench grooves being separated by ridged portions of the substrate so that the trench grooves and the ridged portions are aligned between adjacent two of gate electrode structures, the method comprising the steps of: carrying out a first ion-implantation in a vertical direction to introduce an impurity into the bottoms of the trench grooves and into top portions of the ridged portions by use of gate electrode structures; forming side wall insulation films on side walls of the gate electrode structures; and carrying out a second ion-implantation in an oblique direction with a rotation of the substrate by use of the gate electrode structures and the side walls.

It is preferable that the side wall insulation films on opposite side walls of each of the gate electrode structures have the same height.

It is also preferable that the side wall insulation films on opposite side walls of each of the gate electrode structures have different heights from each other.

It is also preferable that the gate electrode structure has a floating gate electrode and a control gate electrode.

Preferred Embodiment

First Embodiment

A first embodiment according to the present invention will be described in detail with reference to the drawings. A novel method of forming a semiconductor memory device is provided.

Figure 1A:
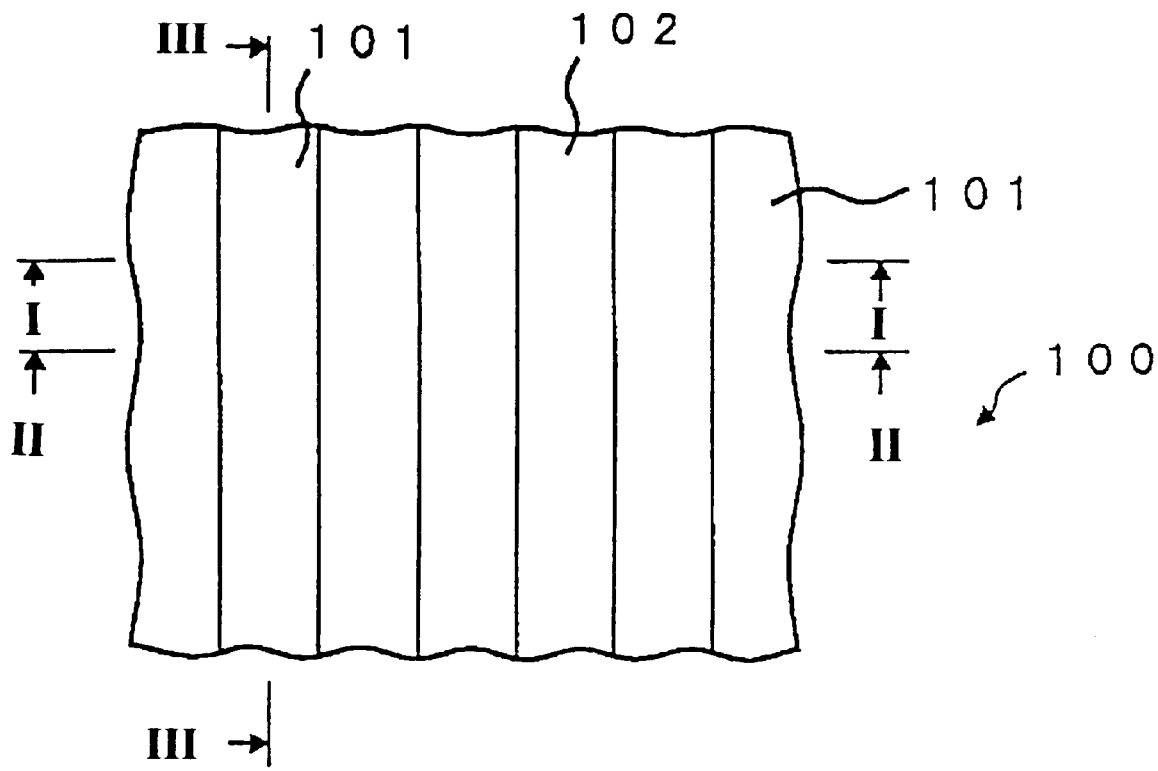
FIG. 1A is a fragmentary plane view illustrative of a semiconductor memory device having a trench isolation structure in a first step involved in a conventional fabrication method.
Figure 1B:
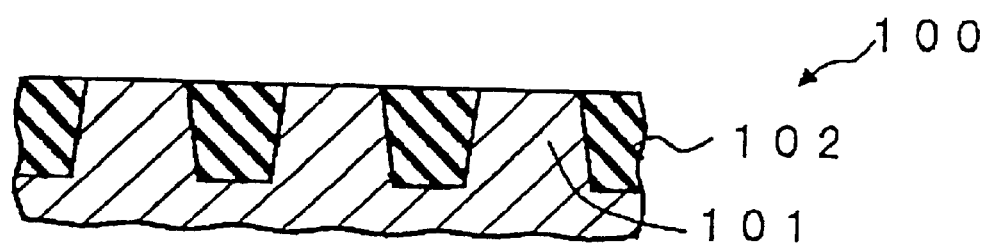
FIG. 1B is a fragmentary cross sectional elevation view illustrative of a semiconductor memory device having a trench isolation structure in a first step involved in a conventional fabrication method, taken along a I—I line of FIG. 1A.
Figure 1C:
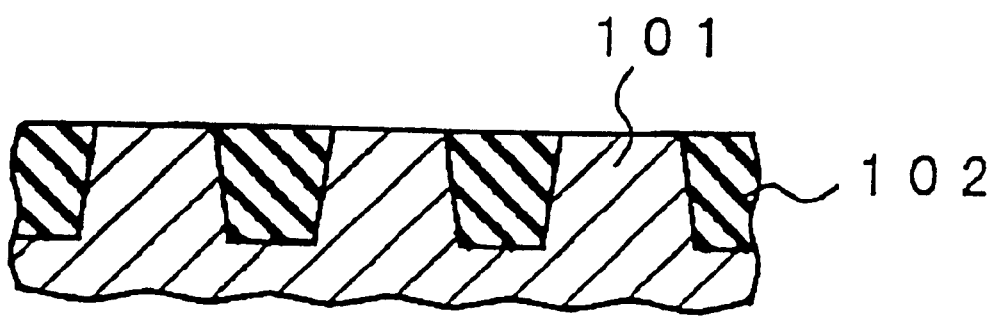
FIG. 1C is a fragmentary cross sectional elevation view illustrative of a semiconductor memory device having a trench isolation structure in a first step involved in a conventional fabrication method, taken along an II—II line of FIG. 1A.
Figure 1D:
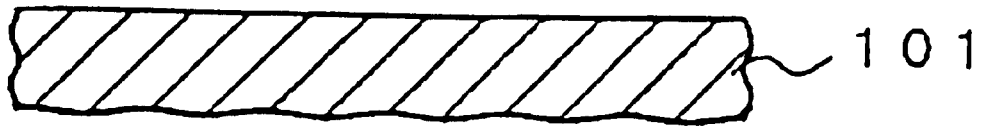
FIG. 1D is a fragmentary cross sectional elevation view illustrative of a semiconductor memory device having a trench isolation structure in a first step involved in a conventional fabrication method, taken along an III—III line of FIG. 1A.
Figure 2A:
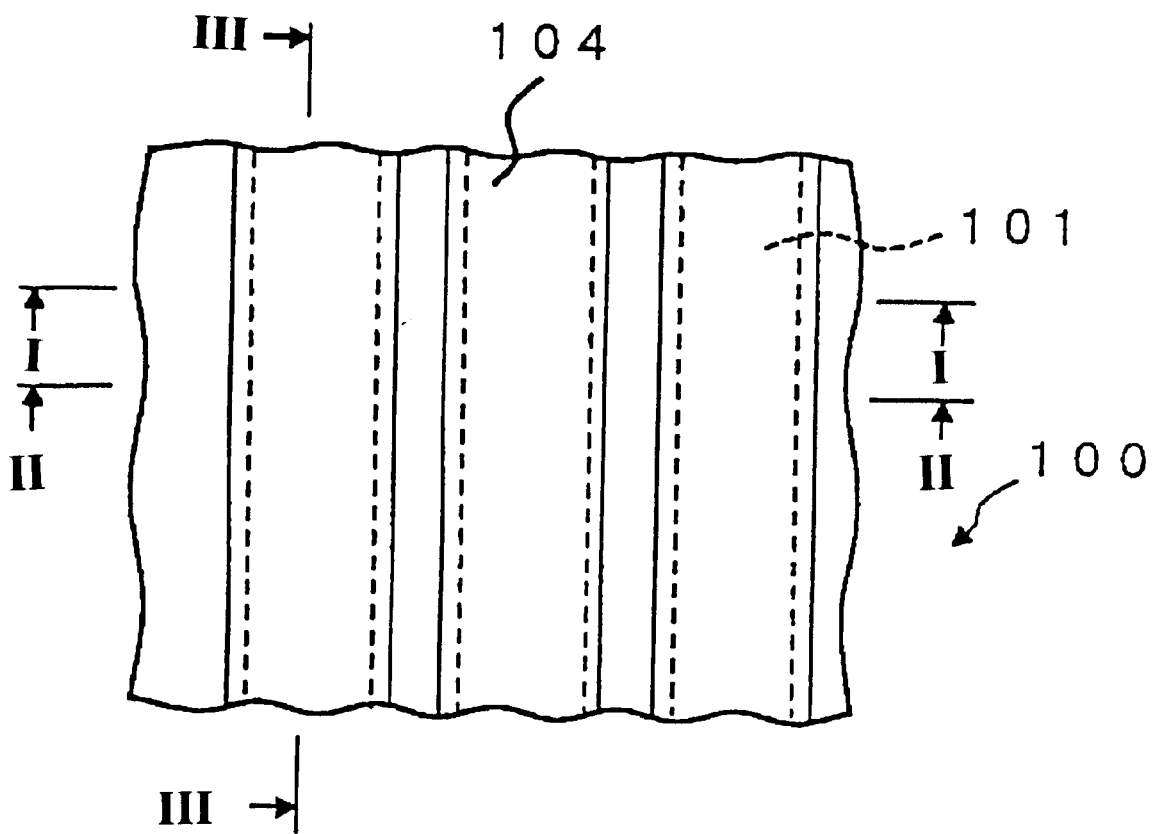
FIG. 2A is a fragmentary plane view illustrative of a semiconductor memory device having a trench isolation structure in a second step involved in a conventional fabrication method.
Figure 2B:
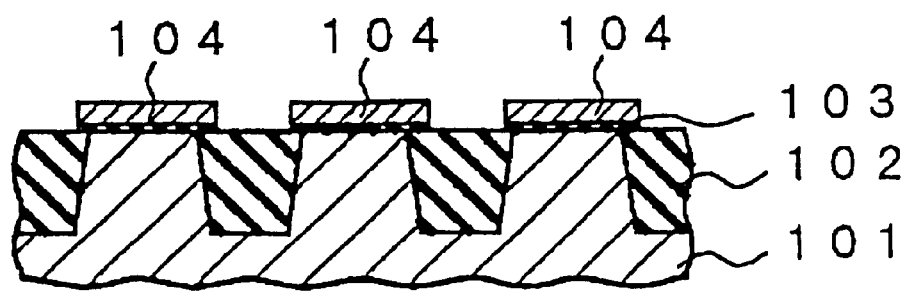
FIG. 2B is a fragmentary cross sectional elevation view illustrative of a semiconductor memory device having a trench isolation structure in a second step involved in a conventional fabrication method, taken along a I—I line of FIG. 2A.
Figure 2C:
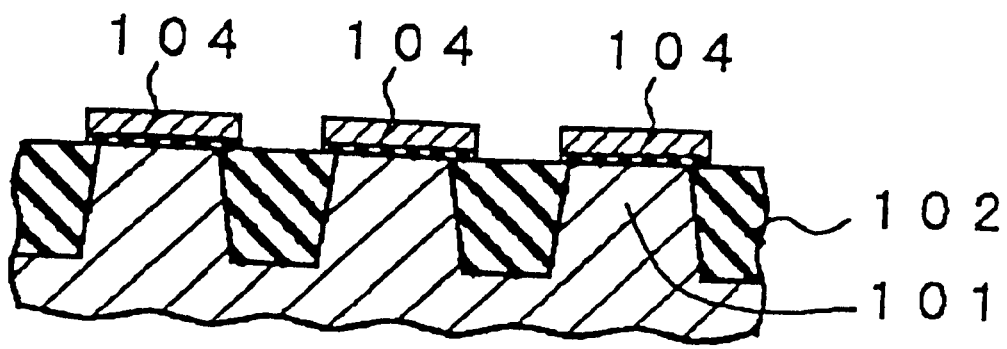
FIG. 2C is a fragmentary cross sectional elevation view illustrative of a semiconductor memory device having a trench isolation structure in a second step involved in a conventional fabrication method, taken along an II—II line of FIG. 2A.
Figure 2D:
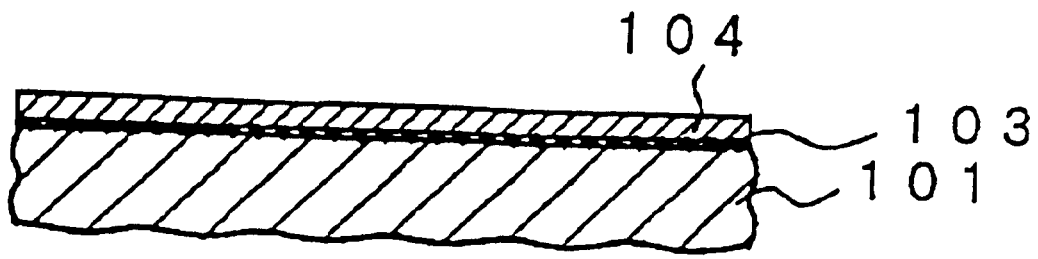
FIG. 2D is a fragmentary cross sectional elevation view illustrative of a semiconductor memory device having a trench isolation structure in a second step involved in a conventional fabrication method, taken along an III—III line of FIG. 2A.
Figure 3A:
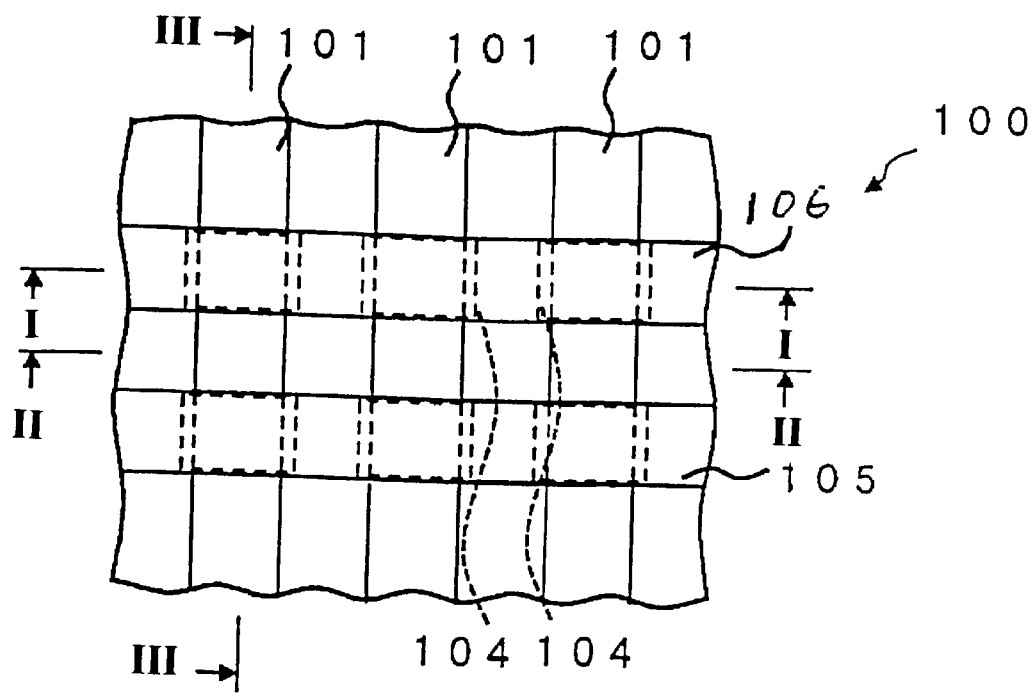
FIG. 3A is a fragmentary plane view illustrative of a semiconductor memory device having a trench isolation structure in a third step involved in a conventional fabrication method.
Figure 3B:
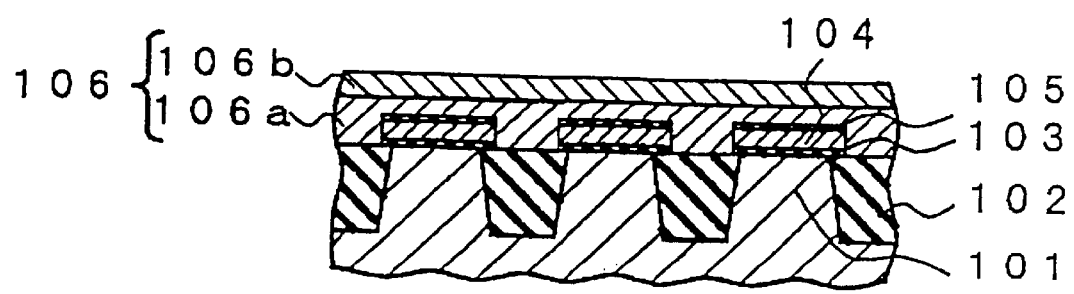
FIG. 3B is a fragmentary cross sectional elevation view illustrative of a semiconductor memory device having a trench isolation structure in a third step involved in a conventional fabrication method, taken along a I—I line of FIG. 3A.
Figure 3C:
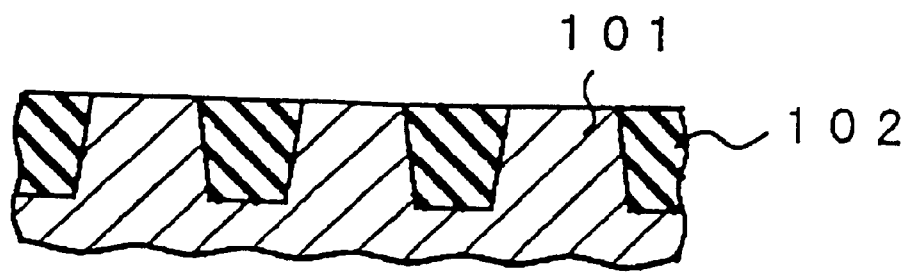
FIG. 3C is a fragmentary cross sectional elevation view illustrative of a semiconductor memory device having a trench isolation structure in a third step involved in a conventional fabrication method, taken along an II—II line of FIG. 3A.
Figure 3D:
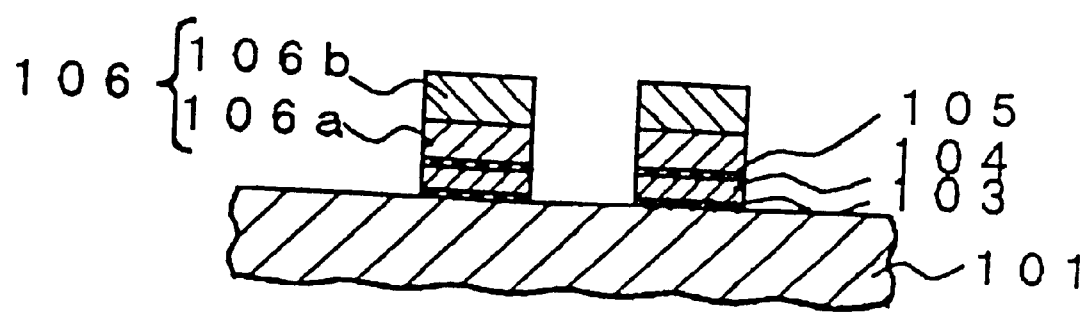
FIG. 3D is a fragmentary cross sectional elevation view illustrative of a semiconductor memory device having a trench isolation structure in a third step involved in a conventional fabrication method, taken along an III—III line of FIG. 3A.
Figure 4A:
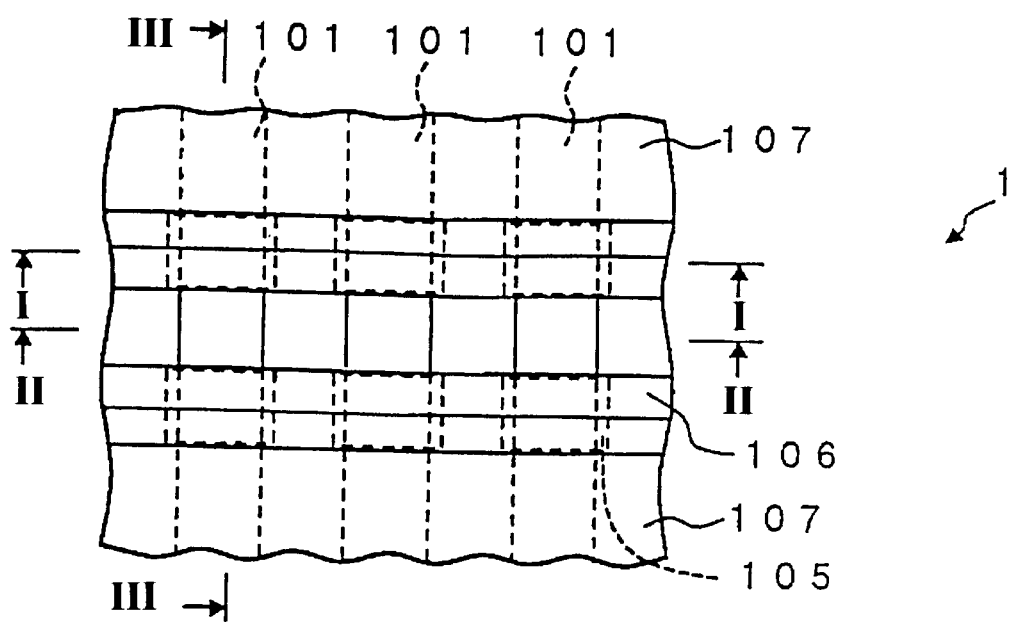
FIG. 4A is a fragmentary plane view illustrative of a semiconductor memory device having a trench isolation structure in a fourth step involved in a conventional fabrication method.
Figure 4B:
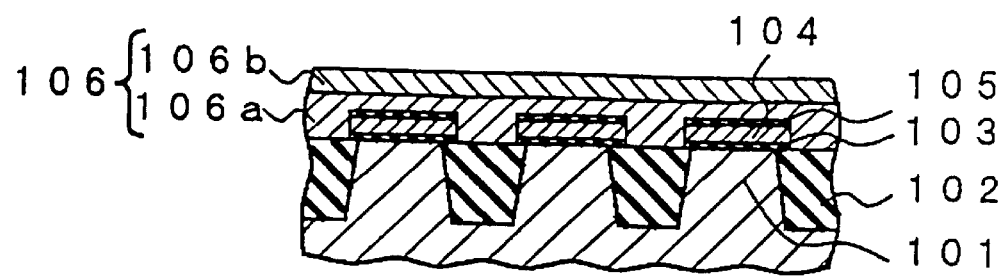
FIG. 4B is a fragmentary cross sectional elevation view illustrative of a semiconductor memory device having a trench isolation structure in a fourth step involved in a conventional fabrication method, taken along a I—I line of FIG. 4A.
Figure 4C:
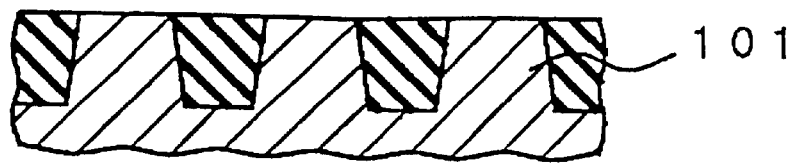
FIG. 4C is a fragmentary cross sectional elevation view illustrative of a semiconductor memory device having a trench isolation structure in a fourth step involved in a conventional fabrication method, taken along an II—II line of FIG. 4A.
Figure 4D:
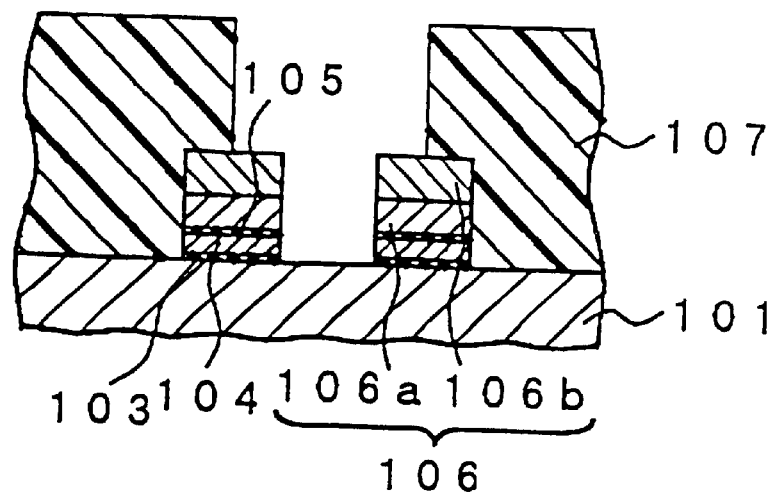
FIG. 4D is a fragmentary cross sectional elevation view illustrative of a semiconductor memory device having a trench isolation structure in a fourth step involved in a conventional fabrication method, taken along an III—III line of FIG. 4A.
Figure 5A:
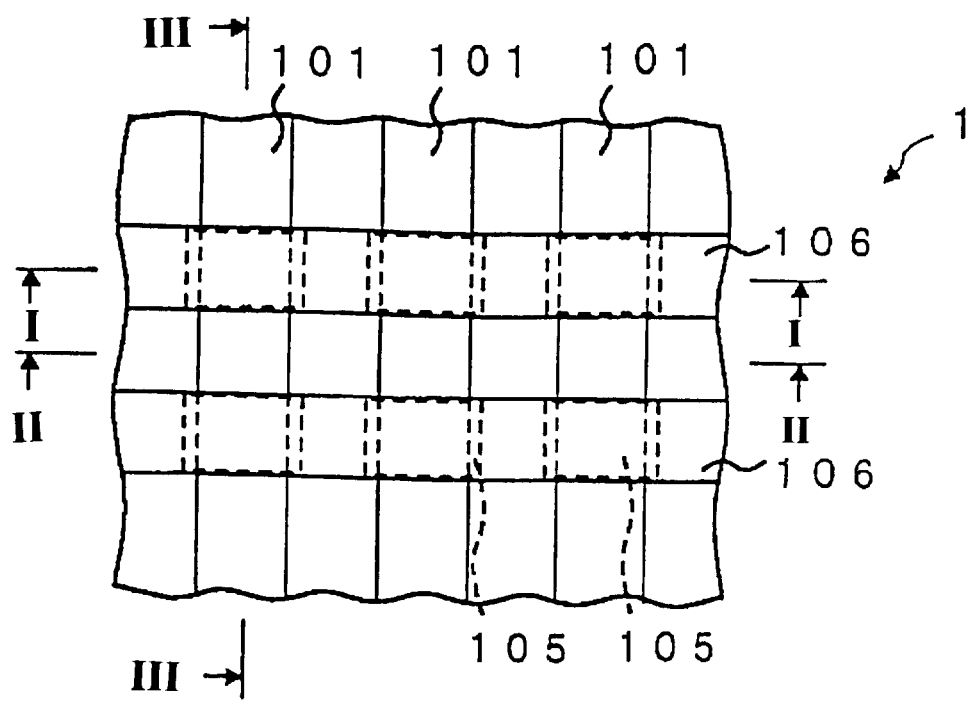
FIG. 5A is a fragmentary plane view illustrative of a semiconductor memory device having a trench isolation structure in a fifth step involved in a conventional fabrication method.
Figure 5B:
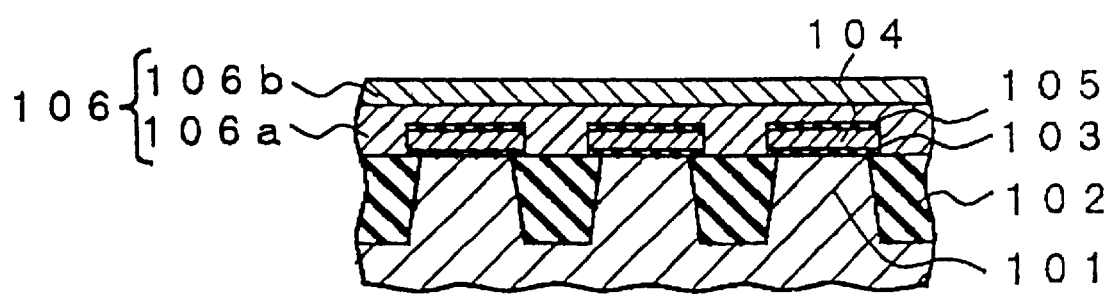
FIG. 5B is a fragmentary cross sectional elevation view illustrative of a semiconductor memory device having a trench isolation structure in a fifth step involved in a conventional fabrication method, taken along a I—I line of FIG. 5A.
Figure 5C:
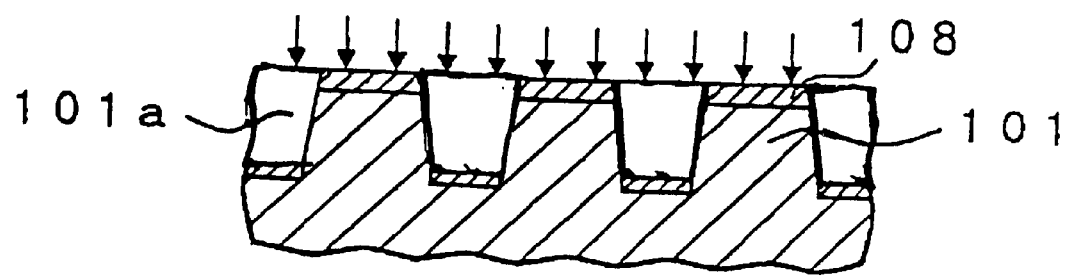
FIG. 5C is a fragmentary cross sectional elevation view illustrative of a semiconductor memory device having a trench isolation structure in a fifth step involved in a conventional fabrication method, taken along an II—II line of FIG. 5A.
Figure 5D:
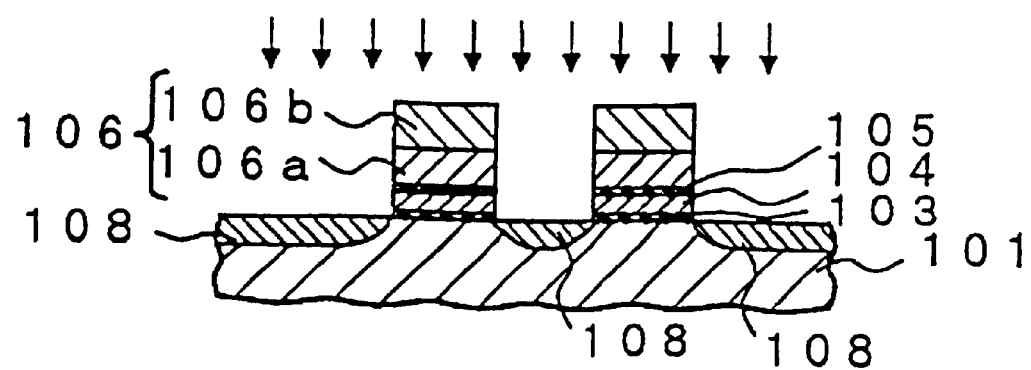
FIG. 5D is a fragmentary cross sectional elevation view illustrative of a semiconductor memory device having a trench isolation structure in a fifth step involved in a conventional fabrication method, taken along an III—III line of FIG. 5A.
Figure 6A:
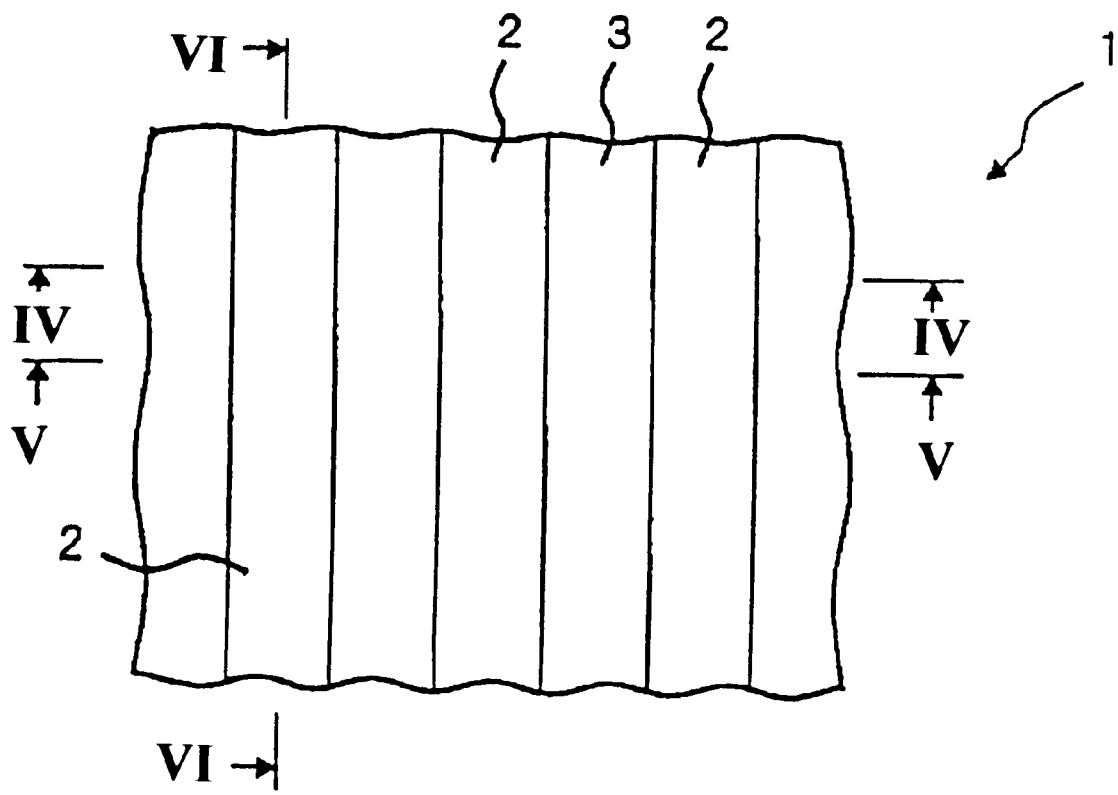
FIG. 6A is a fragmentary plane view illustrative of a semiconductor memory device having a trench isolation structure in a first step involved in a novel fabrication method in a first embodiment in accordance with the present invention.
Figure 6B:
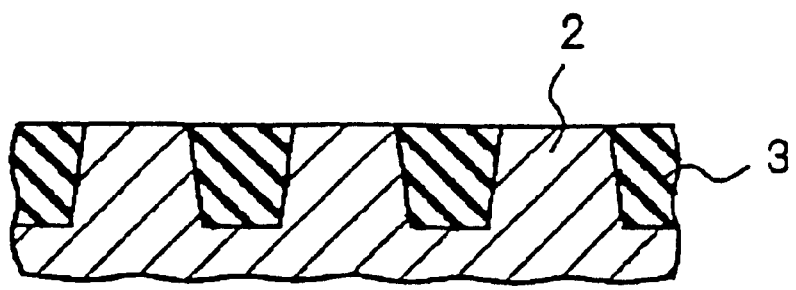
FIG. 6B is a fragmentary cross sectional elevation view illustrative of a semiconductor memory device having a trench isolation structure in a first step involved in a novel fabrication method, taken along an VI—VI line of FIG. 6A.
Figure 6C:
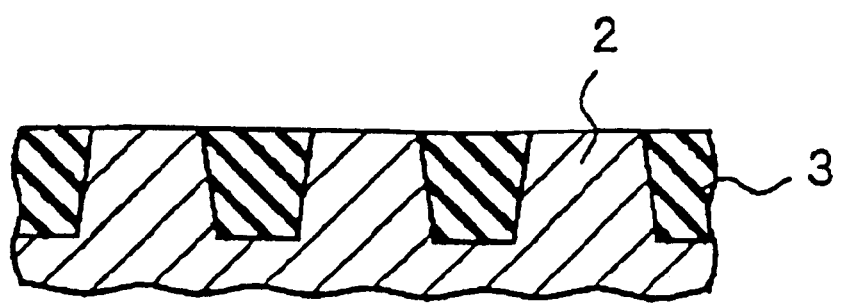
FIG. 6C is a fragmentary cross sectional elevation view illustrative of a semiconductor memory device having a trench isolation structure in a first step involved in a novel fabrication method, taken along a V—V line of FIG. 6A.
Figure 6D:
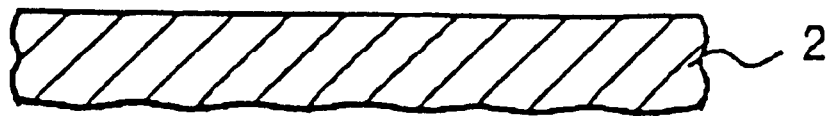
FIG. 6D is a fragmentary cross sectional elevation view illustrative of a semiconductor memory device having a trench isolation structure in a first step involved in a novel fabrication method, taken along an VI—VI line of FIG. 6A.

FIG. 6A is a fragmentary plane view illustrative of a semiconductor memory device having a trench isolation structure in a first step involved in a novel fabrication method in a first embodiment in accordance with the present invention. FIG. 6B is a fragmentary cross sectional elevation view illustrative of a semiconductor memory device having a trench isolation structure in a first step involved in a novel fabrication method, taken along an IV—IV line of FIG. 6A. FIG. 6C is a fragmentary cross sectional elevation view illustrative of a semiconductor memory device having a trench isolation structure in a first step involved in a novel fabrication method, taken along a V—V line of FIG. 6A. FIG. 6D is a fragmentary cross sectional elevation view illustrative of a semiconductor memory device having a trench isolation structure in a first step involved in a novel fabrication method, taken along an VI—VI line of FIG. 6A.

The semiconductor memory device in this embodiment is a trench isolation NOR fresh memory cell, wherein each contact of bit line layer has two bits.

With reference to FIGS. 6A, 6B, 6C and 6D, a reactive ion etching is used to form trench grooves in a surface region of a semiconductor substrate 1 thereby to define a plurality of diffusion layers 2 in the semiconductor substrate 1, wherein each of the trench grooves have a stripe shape in plane view and a trench shape in sectional view. The trench grooves extend in a first horizontal direction and in parallel to each other at a constant pitch. The trench grooves are filled with silicon oxide to form a plurality of trench isolations 3 in the trench grooves, wherein each of the diffusion layers 2 are defined between the adjacent two of the trench isolations 3. The trench isolations 3 have a stripe shape in plane view and a trench shape in sectional view. The trench isolations 3 extend in a first horizontal direction and in parallel to each other at a constant pitch.

Figure 7A:
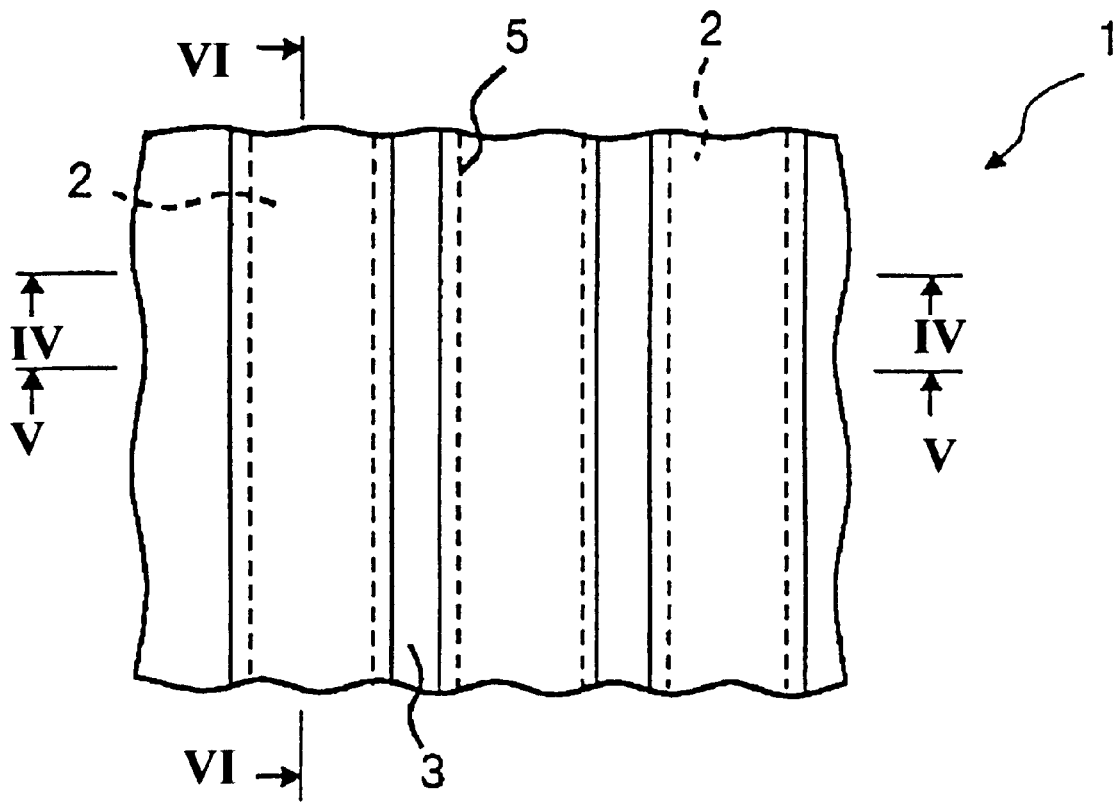
FIG. 7A is a fragmentary plane view illustrative of a semiconductor memory device having a trench isolation structure in a second step involved in a novel fabrication method in a first embodiment in accordance with the present invention.
Figure 7B:
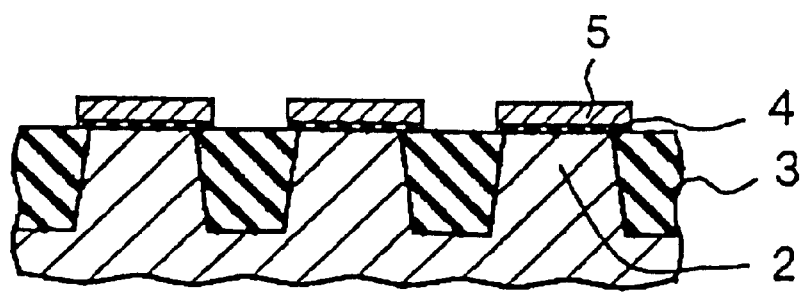
FIG. 7B is a fragmentary cross sectional elevation view illustrative of a semiconductor memory device having a trench isolation structure in a second step involved in a novel fabrication method, taken along an IV—IV line of FIG. 7A.
Figure 7C:
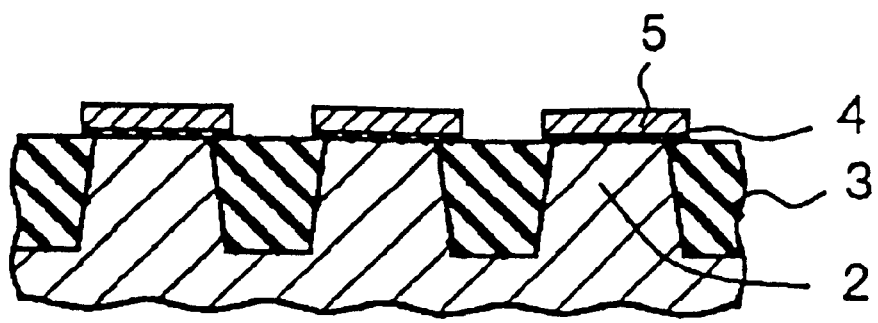
FIG. 7C is a fragmentary cross sectional elevation view illustrative of a semiconductor memory device having a trench isolation structure in a second step involved in a novel fabrication method, taken along a V—V line of FIG. 7A.
Figure 7D:
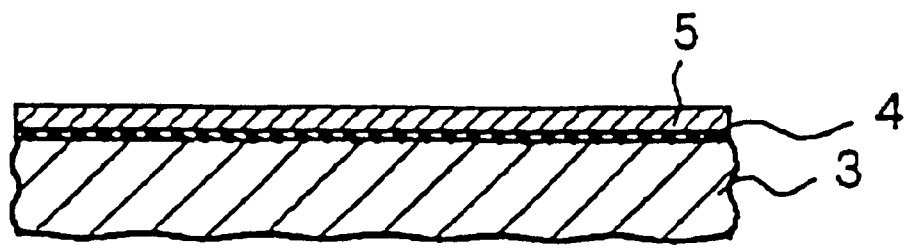
FIG. 7D is a fragmentary cross sectional elevation view illustrative of a semiconductor memory device having a trench isolation structure in a second step involved in a novel fabrication method, taken along an VI—VI line of FIG. 7A.

FIG. 7A is a fragmentary plane view illustrative of a semiconductor memory device having a trench isolation structure in a second step involved in a novel fabrication method in a first embodiment in accordance with the present invention. FIG. 7B is a fragmentary cross sectional elevation view illustrative of a semiconductor memory device having a trench isolation structure in a second step involved in a novel fabrication method, taken along an IV—IV line of FIG. 7A. FIG. 7C is a fragmentary cross sectional elevation view illustrative of a semiconductor memory device having a trench isolation structure in a second step involved in a novel fabrication method, taken along a V—V line of FIG. 7A. FIG. 7D is a fragmentary cross sectional elevation view illustrative of a semiconductor memory device having a trench isolation structure in a second step involved in a novel fabrication method, taken along an VI—VI line of FIG. 7A.

A gate insulation film is formed over surfaces of the diffusion layers 2. A floating gate electrode layer 5 is then formed on the gate insulation film. Laminations of the gate insulation film and the floating gate electrode layer are patterned to form gate insulation films 4 which cover the diffusion layers 2 and the floating gate electrodes 5 on the gate insulation films 4. The floating gate electrodes 5 extend in the first horizontal direction and in parallel to each other at the constant pitch.

Figure 8A:
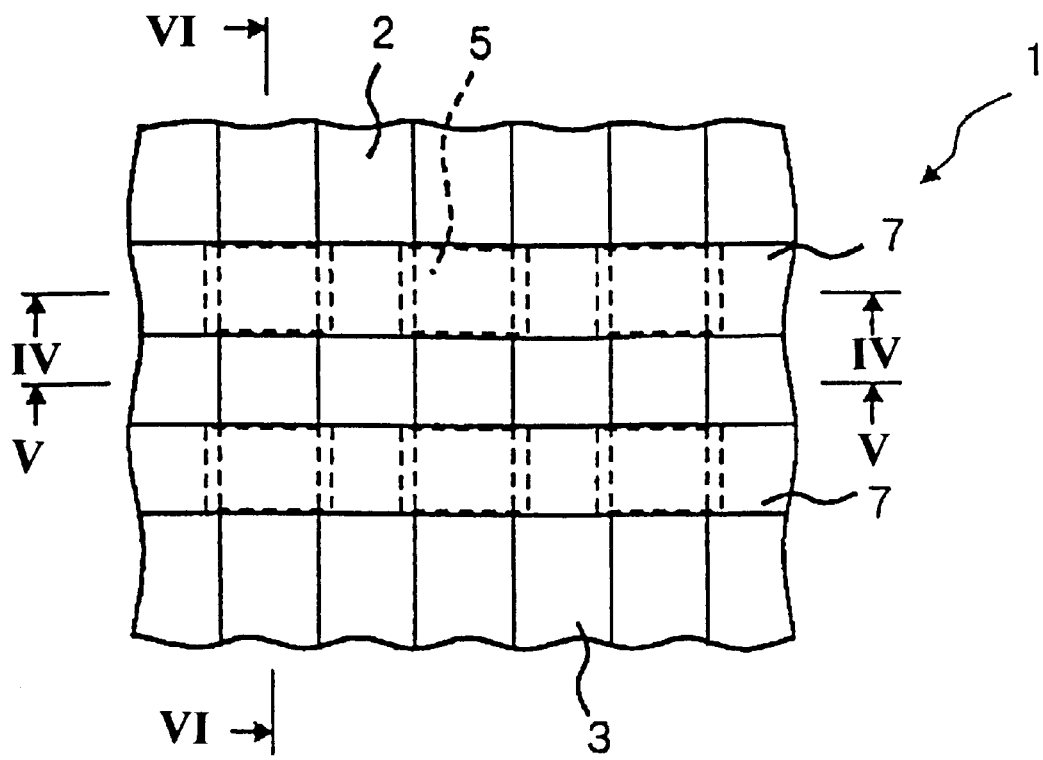
FIG. 8A is a fragmentary plane view illustrative of a semiconductor memory device having a trench isolation structure in a third step involved in a novel fabrication method in a first embodiment in accordance with the present invention.
Figure 8B:
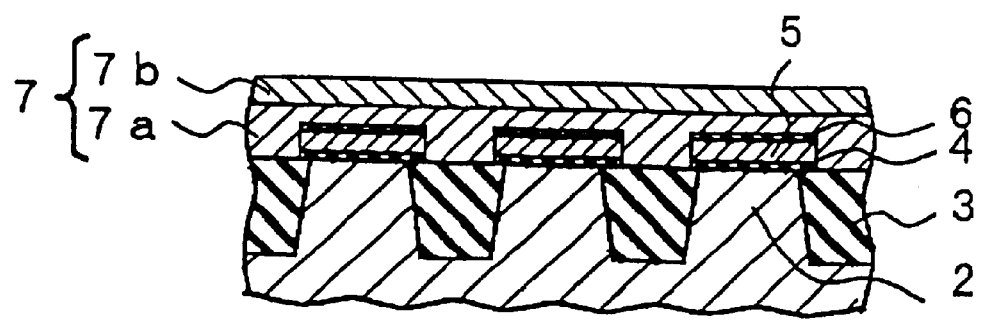
FIG. 8B is a fragmentary cross sectional elevation view illustrative of a semiconductor memory device having a trench isolation structure in a third step involved in a novel fabrication method, taken along an IV—IV line of FIG. 8A.
Figure 8C:
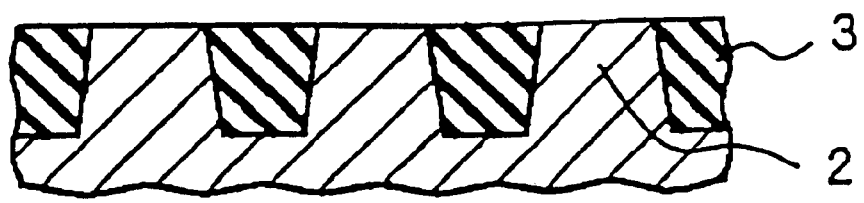
FIG. 8C is a fragmentary cross sectional elevation view illustrative of a semiconductor memory device having a trench isolation structure in a third step involved in a novel fabrication method, taken along a V—V line of FIG. 8A.
Figure 8D:
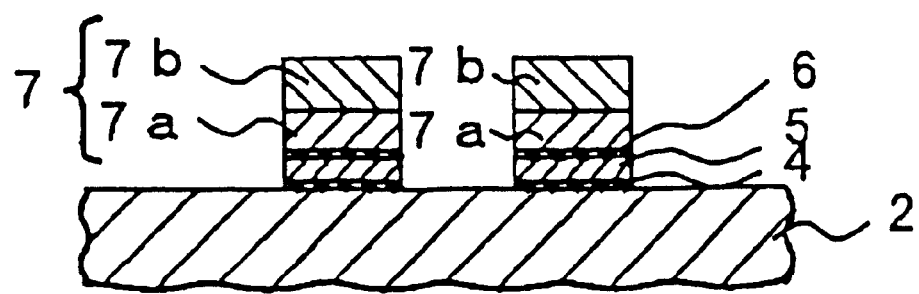
FIG. 8D is a fragmentary cross sectional elevation view illustrative of a semiconductor memory device having a trench isolation structure in a third step involved in a novel fabrication method, taken along an VI—VI line of FIG. 8A.

FIG. 8A is a fragmentary plane view illustrative of a semiconductor memory device having a trench isolation structure in a third step involved in a novel fabrication method in a first embodiment in accordance with the present invention. FIG. 8B is a fragmentary cross sectional elevation view illustrative of a semiconductor memory device having a trench isolation structure in a third step involved in a novel fabrication method, taken along an IV—IV line of FIG. 8A. FIG. 8C is a fragmentary cross sectional elevation view illustrative of a semiconductor memory device having a trench isolation structure in a third step involved in a novel fabrication method, taken along a V—V line of FIG. 8A FIG. 8D is a fragmentary cross sectional elevation view illustrative of a semiconductor memory device having a trench isolation structure in a third step involved in a novel fabrication method, taken along an VI—VI line of FIG. 8A.

An inter-layer insulator 6 is formed over the substrate 1, so that the inter-layer insulator 6 covers the floating gate electrodes 5, wherein the inter-layer insulator 6 comprises laminations of a silicon oxide film, a silicon nitride film and a silicon oxide film. Control gate electrodes 7 are formed over the substrate 1 so that the control gate electrodes 7 are stripe shaped and extend in a second direction perpendicular to the first direction along which the trench isolations 3 extend. The control gate electrodes 7 comprises laminations of a polysilicon layer 7a and a tungsten silicide layer 7b on the polysilicon layer 7a.

Figure 9A:
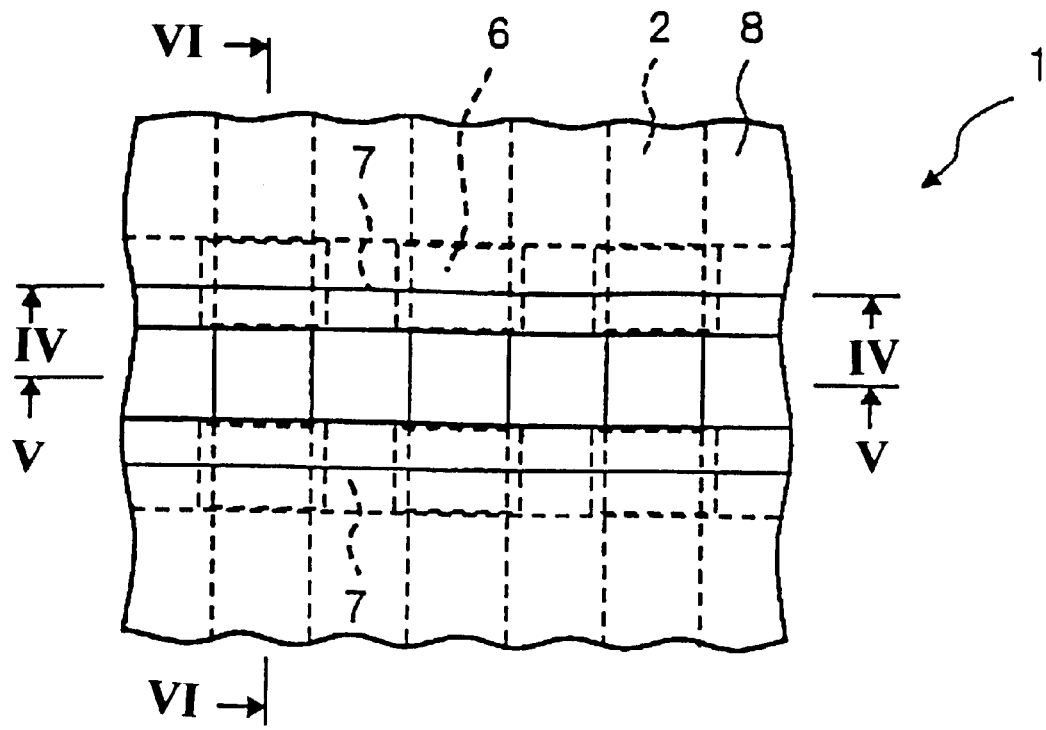
FIG. 9A is a fragmentary plane view illustrative of a semiconductor memory device having a trench isolation structure in a fourth step involved in a novel fabrication method in a first embodiment in accordance with the present invention.
Figure 9B:
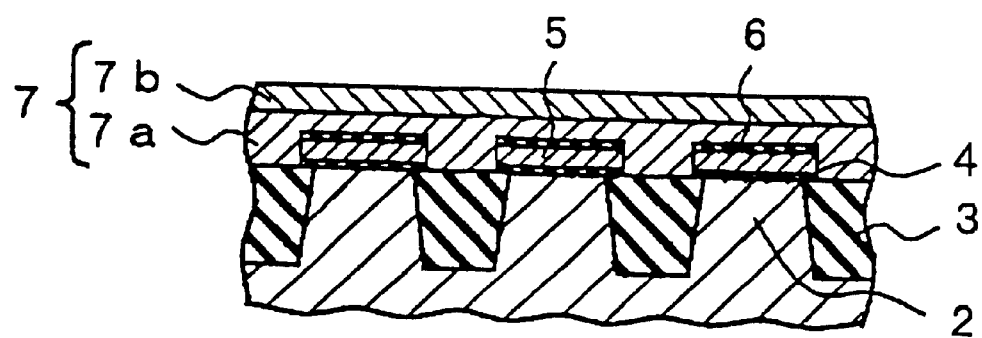
FIG. 9B is a fragmentary cross sectional elevation view illustrative of a semiconductor memory device having a trench isolation structure in a fourth step involved in a novel fabrication method, taken along an IV—IV line of FIG. 9A.
Figure 9C:
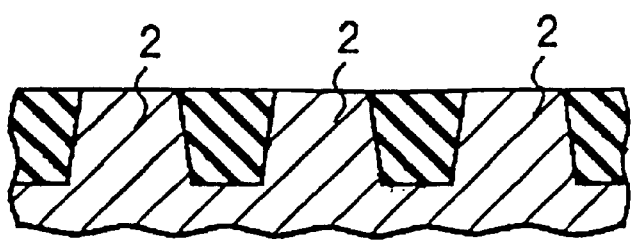
FIG. 9C is a fragmentary cross sectional elevation view illustrative of a semiconductor memory device having a trench isolation structure in a fourth step involved in a novel fabrication method, taken along a V—V line of FIG. 9A.
Figure 9D:
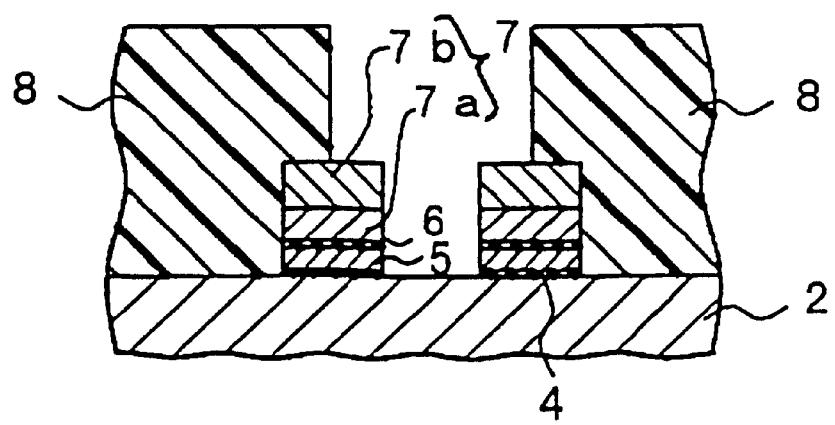
FIG. 9D is a fragmentary cross sectional elevation view illustrative of a semiconductor memory device having a trench isolation structure in a fourth step involved in a novel fabrication method, taken along an VI—VI line of FIG. 9A.

FIG. 9A is a fragmentary plane view illustrative of a semiconductor memory device having a trench isolation structure in a fourth step involved in a novel fabrication method in a first embodiment in accordance with the present invention. FIG. 9B is a fragmentary cross sectional elevation view illustrative of a semiconductor memory device having a trench isolation structure in a fourth step involved in a novel fabrication method, taken along an IV—IV line of FIG. 9A. FIG. 9C is a fragmentary cross sectional elevation view illustrative of a semiconductor memory device having a trench isolation structure in a fourth step involved in a novel fabrication method, taken along a V—V line of FIG. 9A. FIG. 9D is a fragmentary cross sectional elevation view illustrative of a semiconductor memory device having a trench isolation structure in a fourth step involved in a novel fabrication method, taken along an VI—VI line of FIG. 9A.

A photo-resist pattern 8 is selectively formed which has an opening which is positioned over a gap between the adjacent two of the control gate electrode 7 and also over confronting half sides of the adjacent two of the control gate electrode 7. The photo-resist pattern 8 and the control gate electrodes 7 are used as masks to carry out an etching to the trench isolations 3, so that trench grooves are formed.

Figure 10A:
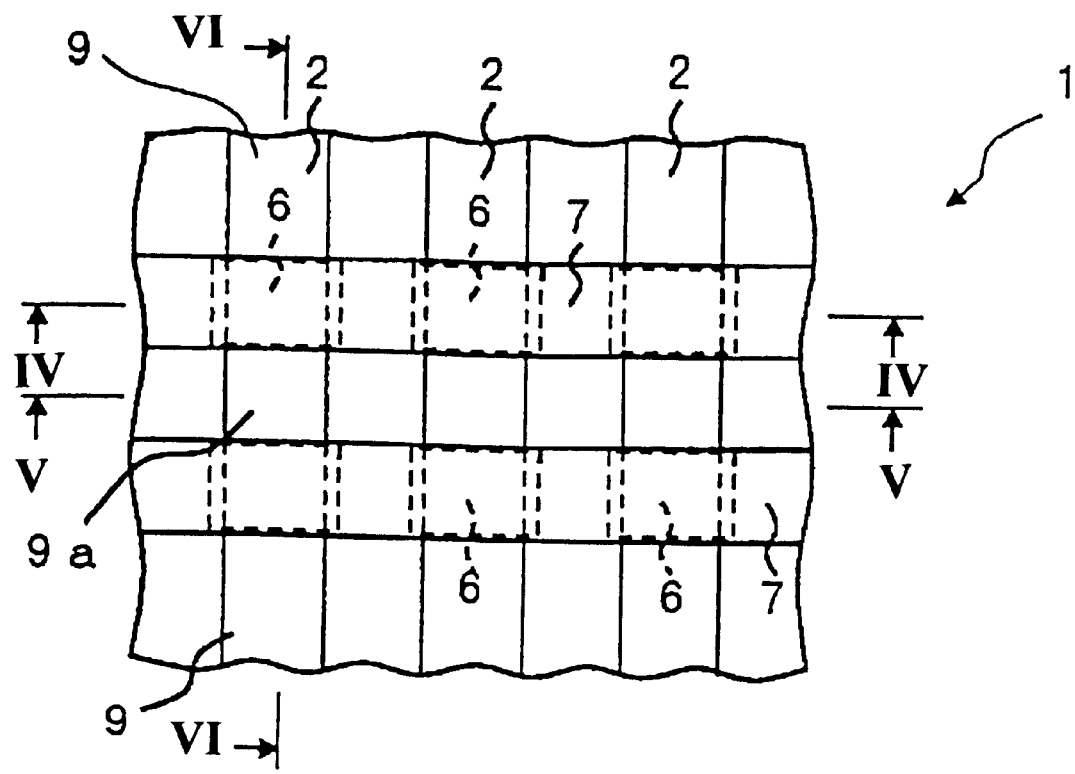
FIG. 10A is a fragmentary plane view illustrative of a semiconductor memory device having a trench isolation structure in a fifth step involved in a novel fabrication method in a first embodiment in accordance with the present invention.
Figure 10B:
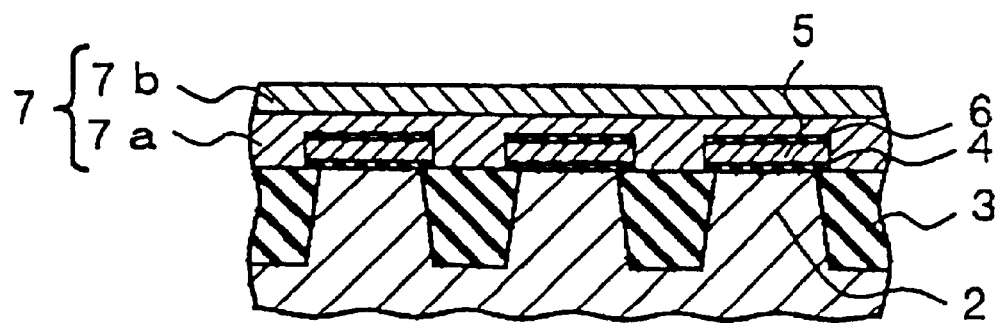
FIG. 10B is a fragmentary cross sectional elevation view illustrative of a semiconductor memory device having a trench isolation structure in a fifth step involved in a novel fabrication method, taken along an IV—IV line of FIG. 10A.
Figure 10C:
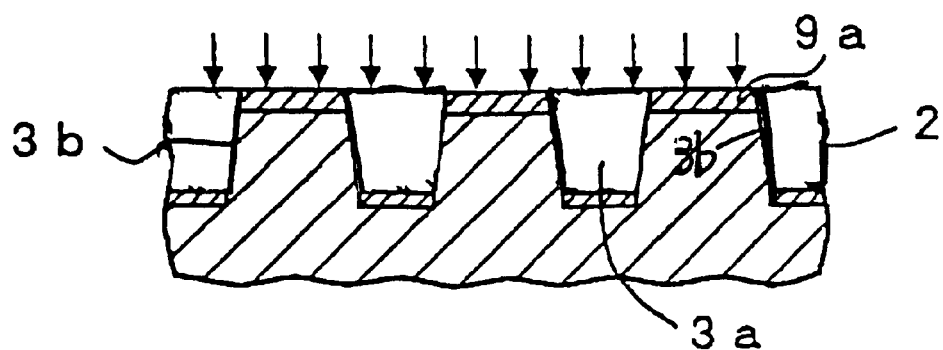
FIG. 10C is a fragmentary cross sectional elevation view illustrative of a semiconductor memory device having a trench isolation structure in a fifth step involved in a novel fabrication method, taken along a V—V line of FIG. 10A.
Figure 10D:
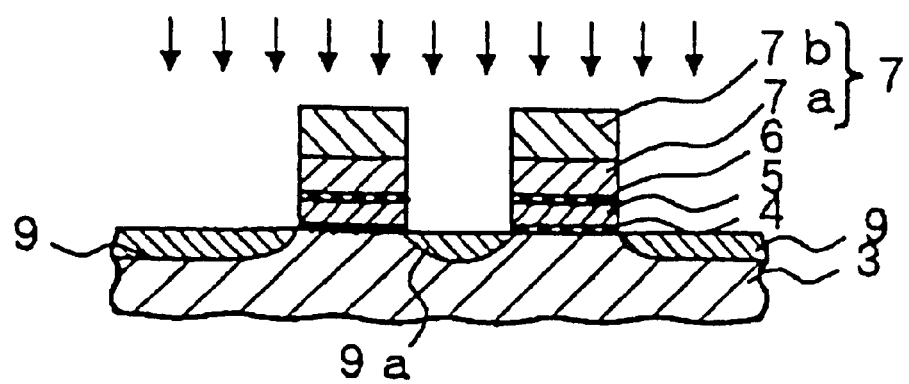
FIG. 10D is a fragmentary cross sectional elevation view illustrative of a semiconductor memory device having a trench isolation structure in a fifth step involved in a novel fabrication method, taken along an VI—VI line of FIG. 10A.

FIG. 10A is a fragmentary plane view illustrative of a semiconductor memory device having a trench isolation structure in a fifth step involved in a novel fabrication method in a first embodiment in accordance with the present invention. FIG. 10B is a fragmentary cross sectional elevation view illustrative of a semiconductor memory device having a trench isolation structure in a fifth step involved in a novel fabrication method, taken along an IV—IV line of FIG. 10A. FIG. 10C is a fragmentary cross sectional elevation view illustrative of a semiconductor memory device having a trench isolation structure in a fifth step involved in a novel fabrication method, taken along a V—V line of FIG. 10A. FIG. 10D is a fragmentary cross sectional elevation view illustrative of a semiconductor memory device having a trench isolation structure in a fifth step involved in a novel fabrication method, taken along an VI—VI line of FIG. 10A.

An ion-implantation of an impurity such as arsenic is carried out by using the control gate electrodes 7 and the photo-resist pattern 8 as masks in a vertical direction to the surface of the substrate to form source diffusion layers 9a in upper regions of the diffusion regions 2 and in bottom regions of the etched trench grooves 3b. Etched trench grooves 3b have a trench structure, for which reason an insufficient amount of an impurity such as arsenic is introduced to the side surfaces 2a of the etched trench grooves 3a. After the photoresist pattern 8 is removed, the control gate electrode 7 is used to carry out a second ion-implantation of an impurity such as arsenic to form source and drain diffusion layers 9. A silicon oxide film is grown on an entire surface of the substrate 1 for subsequent etch back to the silicon oxide film so as to form side wall oxide films 10 on both side walls of the control gate electrodes 7.

Figure 11A:
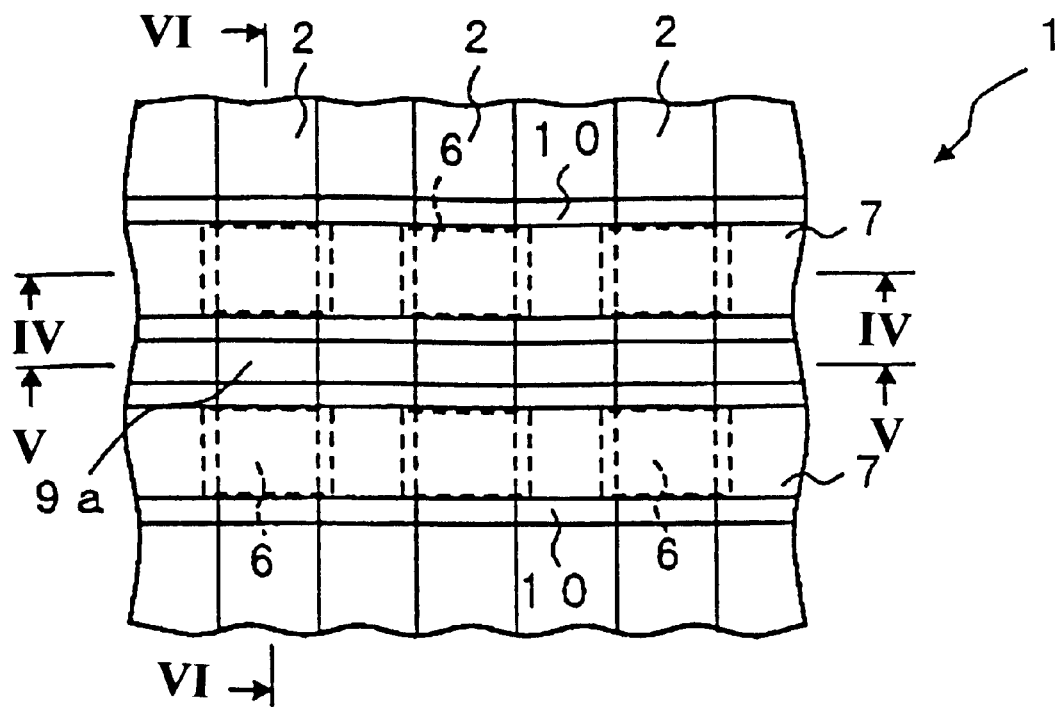
FIG. 11A is a fragmentary plane view illustrative of a semiconductor memory device having a trench isolation structure in a sixth step involved in a novel fabrication method in a first embodiment in accordance with the present invention.
Figure 11B:
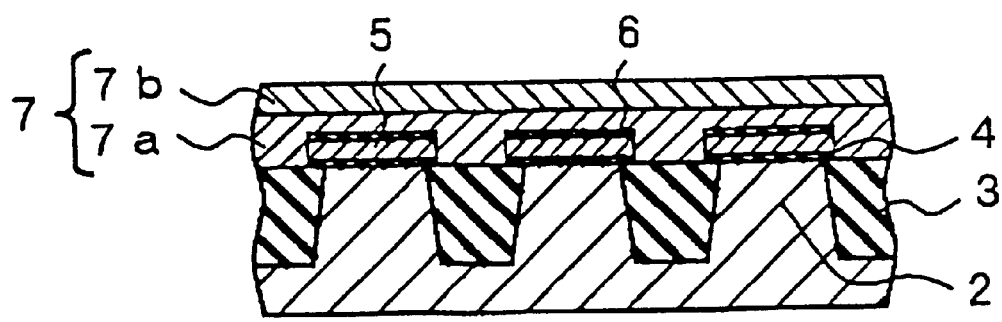
FIG. 11B is a fragmentary cross sectional elevation view illustrative of a semiconductor memory device having a trench isolation structure in a sixth step involved in a novel fabrication method, taken along an IV—IV line of FIG. 111A.
Figure 11C:
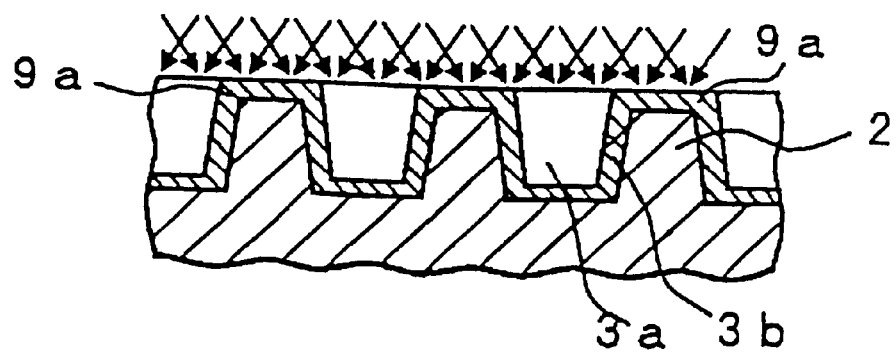
FIG. 11C is a fragmentary cross sectional elevation view illustrative of a semiconductor memory device having a trench isolation structure in a sixth step involved in a novel fabrication method, taken along a V—V line of FIG. 11A.
Figure 11D:
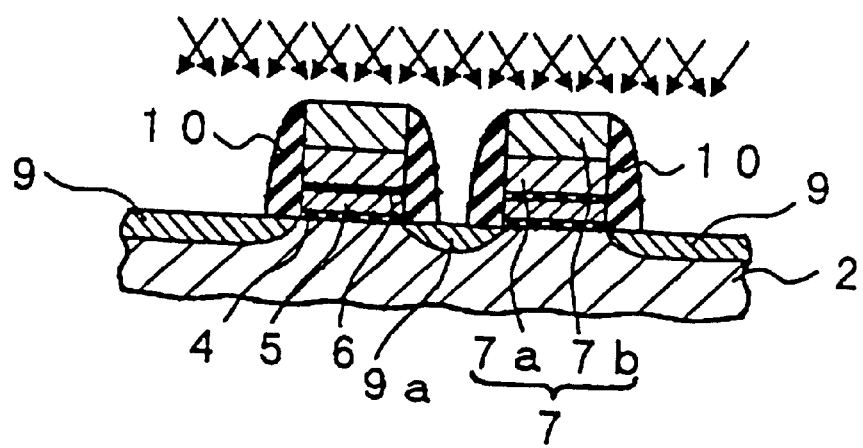
FIG. 11D is a fragmentary cross sectional elevation view illustrative of a semiconductor memory device having a trench isolation structure in a sixth step involved in a novel fabrication method, taken along an VI—VI line of FIG. 11A.

FIG. 11A is a fragmentary plane view illustrative of a semiconductor memory device having a trench isolation structure in a sixth step involved in a novel fabrication method in a first embodiment in accordance with the present invention. FIG. 11B is a fragmentary cross sectional elevation view illustrative of a semiconductor memory device having a trench isolation structure in a sixth step involved in a novel fabrication method, taken along an IV—IV line of FIG. 11A. FIG. 11C is a fragmentary cross sectional elevation view illustrative of a semiconductor memory device having a trench isolation structure in a sixth step involved in a novel fabrication method, taken along a V—V line of FIG. 11A. FIG. 11D is a fragmentary cross sectional elevation view illustrative of a semiconductor memory device having a trench isolation structure in a sixth step involved in a novel fabrication method, taken along an VI—VI line of FIG. 11A.

A third ion-implantation of an impurity such as arsenic is carried out in an oblique direction with rotation of the substrate 1 by use of the control gate electrodes 7 and the side wall oxide films 10 so as to introduce a sufficient amount of the impurity into the side surfaces of the etched trench grooves 3a whereby the source diffusion layer 9a is formed in the side surfaces 3b of the etched trench grooves. The side wall oxide films 10 prevent introduction of the impurity into a channel region between the source and drain diffusion layers 9. As a result, a problem with a punch through can be prevented.

An isolation layer not illustrated is formed entirely over the substrate 1 for subsequent patterning the isolation layer to form a contact portion in the source and drain regions 9 whereby one section has one set of two floating gate electrodes 5 which sandwich the source diffusion layer 9a. A bit line layer is formed so that the contact portion is filled with the bit line layer whereby the trench isolation NOR flash memory cell is formed, where one contact of the bit line layer has two bits.

In accordance with the above novel method, after the trench isolations were removed to have formed the etched trench grooves 3a, then the ion-implantation is carried out in the oblique direction with rotation of the substrate so that the sufficient amount of the impurity can be introduced into the side surfaces 3b of the etched trench grooves 3a, thereby forming the diffusion layers can be formed on the side surfaces 3b of the etched trench grooves 3a. As a result, the resistance of the source diffusion layer 9a can be reduced. The side wall oxide films 10 prevent introduction of the impurity into a channel region between the source and drain diffusion layers 9. As a result, a problem with a punch through can be prevented.

Second Embodiment

A second embodiment according to the present invention will be described in detail with reference to the drawings. A novel method of forming a semiconductor memory device is provided.

Figure 12A:
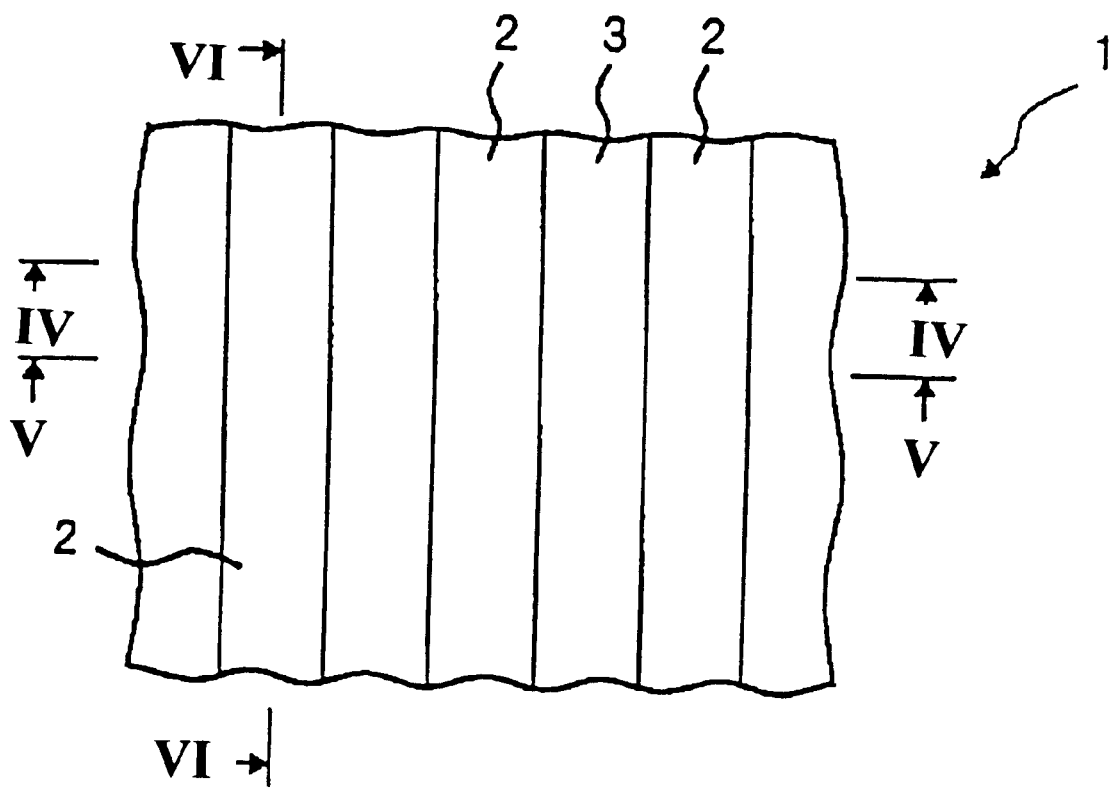
FIG. 12A is a fragmentary plane view illustrative of a semiconductor memory device having a trench isolation structure in a first step involved in a novel fabrication method in a second embodiment in accordance with the present invention.
Figure 12B:
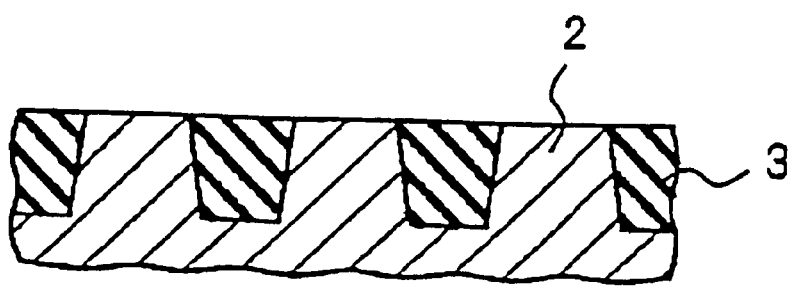
FIG. 12B is a fragmentary cross sectional elevation view illustrative of a semiconductor memory device having a trench isolation structure in a first step involved in a novel fabrication method, taken along an IV—IV line of FIG. 12A.
Figure 12C:
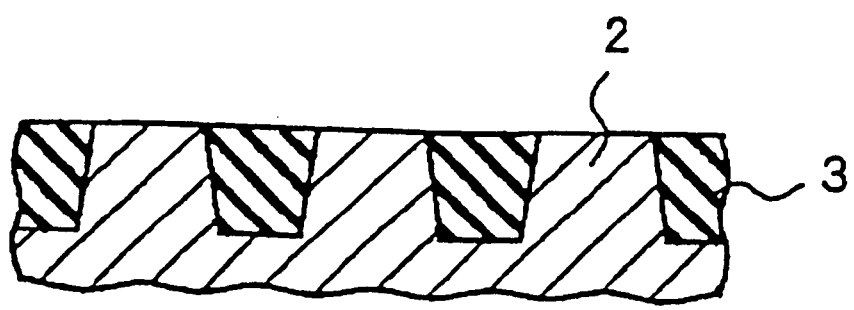
FIG. 12C is a fragmentary cross sectional elevation view illustrative of a semiconductor memory device having a trench isolation structure in a first step involved in a novel fabrication method, taken along a V—V line of FIG. 12A.
Figure 12D:
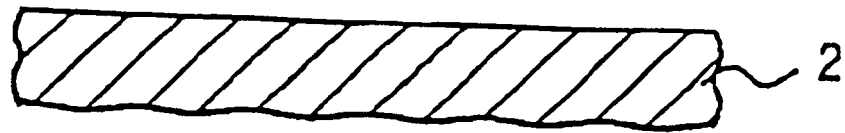
FIG. 12D is a fragmentary cross sectional elevation view illustrative of a semiconductor memory device having a trench isolation structure in a first step involved in a novel fabrication method, taken along an VI—VI line of FIG. 12A.

FIG. 12A is a fragmentary plane view illustrative of a semiconductor memory device having a trench isolation structure in a first step involved in a novel fabrication method in a second embodiment in accordance with the present invention. FIG. 12B is a fragmentary cross sectional elevation view illustrative of a semiconductor memory device having a trench isolation structure in a first step involved in a novel fabrication method, taken along an IV—IV line of FIG. 12A. FIG. 12C is a fragmentary cross sectional elevation view illustrative of a semiconductor memory device having a trench isolation structure in a first step involved in a novel fabrication method, taken along a V—V line of FIG. 12A. FIG. 12D is a fragmentary cross sectional elevation view illustrative of a semiconductor memory device having a trench isolation structure in a first step involved in a novel fabrication method, taken along an VI—VI line of FIG. 12A.

The semiconductor memory device in this embodiment is a trench isolation NOR fresh memory cell, wherein each contact of bit line layer has two bits.

With reference to FIGS. 12A, 12B, 12C and 12D, a reactive ion etching is used to form trench grooves in a surface region of a semiconductor substrate 1 thereby to define a plurality of diffusion layers 2 in the semiconductor substrate 1, wherein each of the trench grooves have a stripe shape in plane view and a trench shape in sectional view. The trench grooves extend in a first horizontal direction and in parallel to each other at a constant pitch. The trench grooves are filled with silicon oxide to form a plurality of trench isolations 3 in the trench grooves, wherein each of the diffusion layers 2 are defined between the adjacent two of the trench isolations 3. The trench isolations 3 have a stripe shape in plane view and a trench shape in sectional view. The trench isolations 3 extend in a first horizontal direction and in parallel to each other at a constant pitch.

Figure 13A:
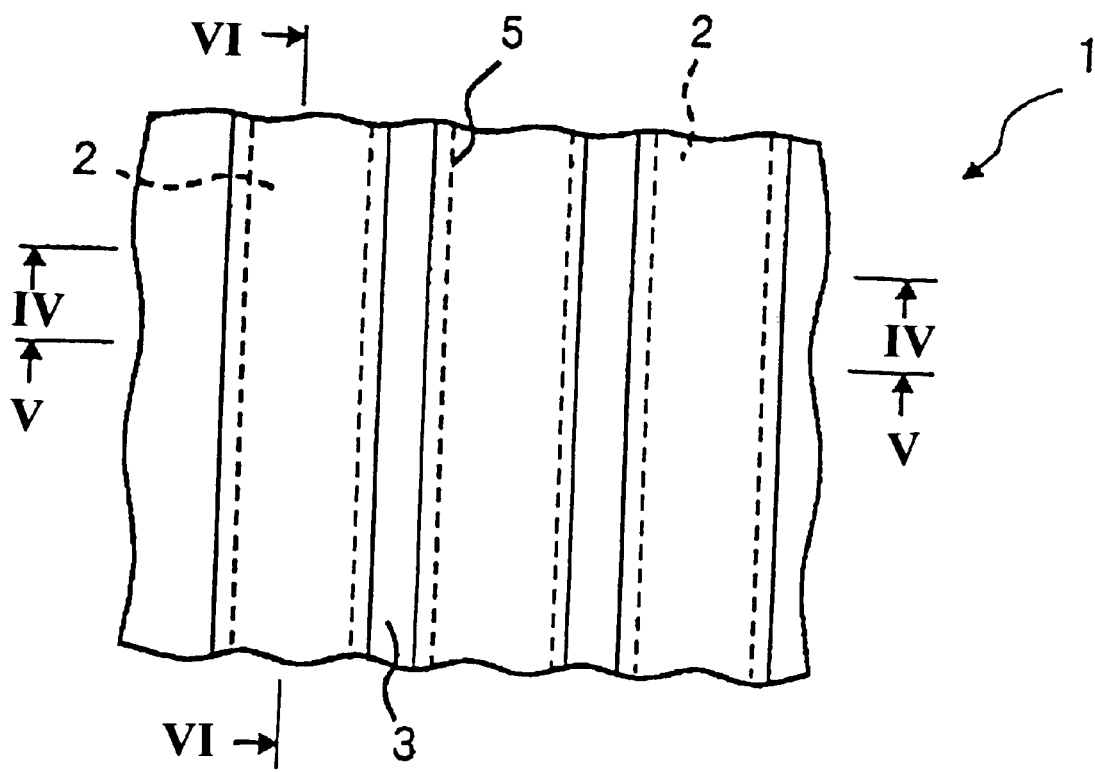
FIG. 13A is a fragmentary plane view illustrative of a semiconductor memory device having a trench isolation structure in a second step involved in a novel fabrication method in a second embodiment in accordance with the present invention.
Figure 13B:
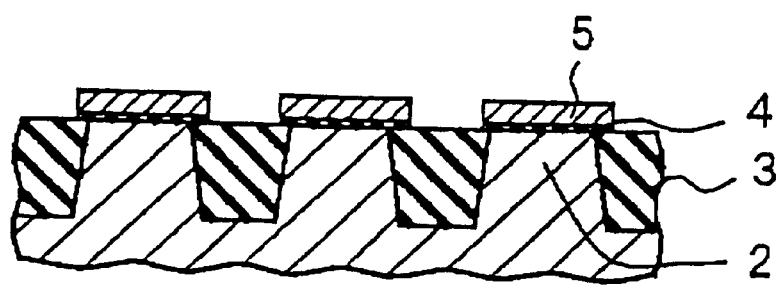
FIG. 13B is a fragmentary cross sectional elevation view illustrative of a semiconductor memory device having a trench isolation structure in a second step involved in a novel fabrication method, taken along an IV—IV line of FIG. 13A.
Figure 13C:
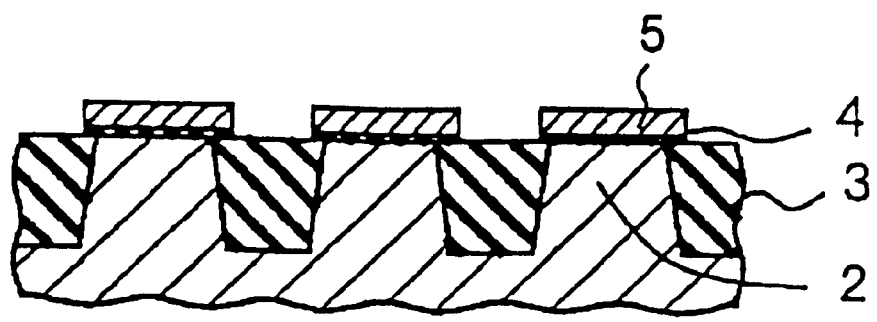
FIG. 13C is a fragmentary cross sectional elevation view illustrative of a semiconductor memory device having a trench isolation structure in a second step involved in a novel fabrication method, taken along a V—V line of FIG. 13A.
Figure 13D:
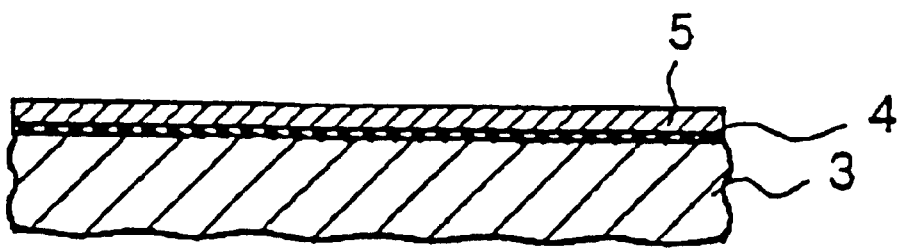
FIG. 13D is a fragmentary cross sectional elevation view illustrative of a semiconductor memory device having a trench isolation structure in a second step involved in a novel fabrication method, taken along an VI—VI line of FIG. 13A.

FIG. 13A is a fragmentary plane view illustrative of a semiconductor memory device having a trench isolation structure in a second step involved in a novel fabrication method in a second embodiment in accordance with the present invention. FIG. 13B is a fragmentary cross sectional elevation view illustrative of a semiconductor memory device having a trench isolation structure in a second step involved in a novel fabrication method, taken along an IV—IV line of FIG. 13A. FIG. 13C is a fragmentary cross sectional elevation view illustrative of a semiconductor memory device having a trench isolation structure in a second step involved in a novel fabrication method, taken along a V—V line of FIG. 13A. FIG. 13D is a fragmentary cross sectional elevation view illustrative of a semiconductor memory device having a trench isolation structure in a second step involved in a novel fabrication method, taken along an VI—VI line of FIG. 13A.

A gate insulation film is formed over surfaces of the diffusion layers 2. A floating gate electrode layer 5 is then formed on the gate insulation film. Laminations of the gate insulation film and the floating gate electrode layer are patterned to form gate insulation films 4 which cover the diffusion layers 2 and the floating gate electrodes 5 on the gate insulation films 4. The floating gate electrodes 5 extend in the first horizontal direction and in parallel to each other at the constant pitch.

Figure 14A:
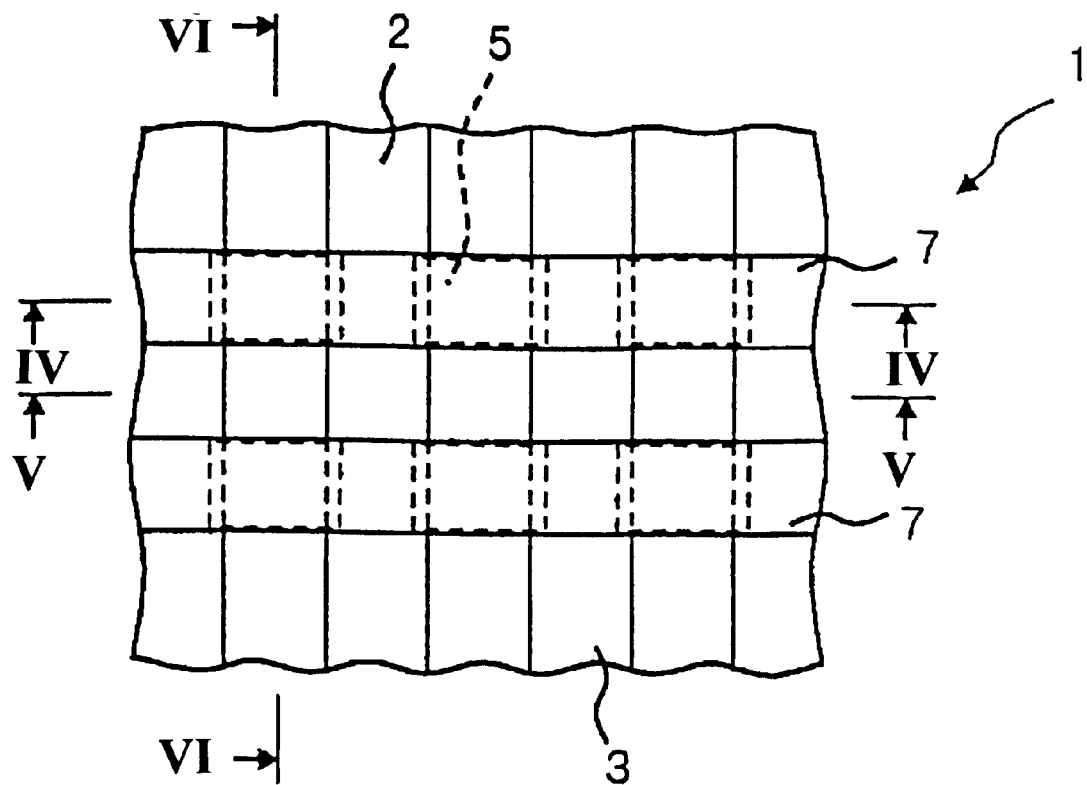
FIG. 14A is a fragmentary plane view illustrative of a semiconductor memory device having a trench isolation structure in a third step involved in a novel fabrication method in a second embodiment in accordance with the present invention.
Figure 14B:
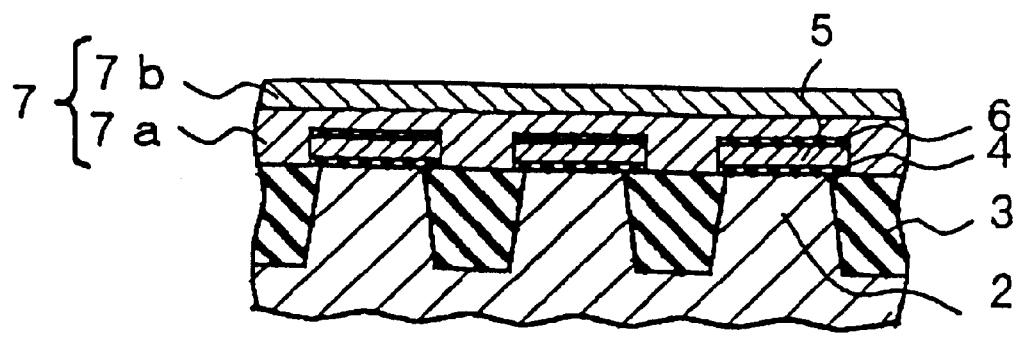
FIG. 14B is a fragmentary cross sectional elevation view illustrative of a semiconductor memory device having a trench isolation structure in a third step involved in a novel fabrication method, taken along an IV—IV line of FIG. 14A.
Figure 14C:
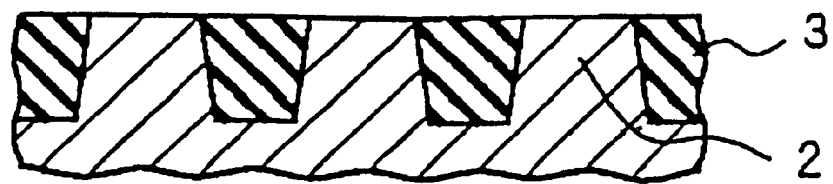
FIG. 14C is a fragmentary cross sectional elevation view illustrative of a semiconductor memory device having a trench isolation structure in a third step involved in a novel fabrication method, taken along a V—V line of FIG. 14A.
Figure 14D:
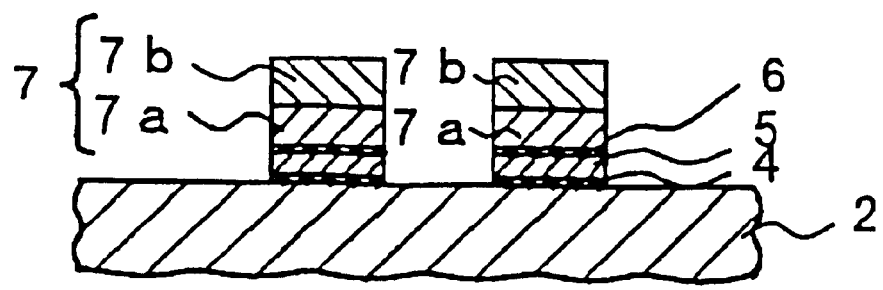
FIG. 14D is a fragmentary cross sectional elevation view illustrative of a semiconductor memory device having a trench isolation structure in a third step involved in a novel fabrication method, taken along an VI—VI line of FIG. 14A.

FIG. 14A is a fragmentary plane view illustrative of a semiconductor memory device having a trench isolation structure in a third step involved in a novel fabrication method in a second embodiment in accordance with the present invention. FIG. 14B is a fragmentary cross sectional elevation view illustrative of a semiconductor memory device having a trench isolation structure in a third step involved in a novel fabrication method, taken along an IV—IV line of FIG. 14A. FIG. 14C is a fragmentary cross sectional elevation view illustrative of a semiconductor memory device having a trench isolation structure in a third step involved in a novel fabrication method, taken along a V—V line of FIG. 14A. FIG. 14D is a fragmentary cross sectional elevation view illustrative of a semiconductor memory device having a trench isolation structure in a third step involved in a novel fabrication method, taken along an VI—VI line of FIG. 14A.

An inter-layer insulator 6 is formed over the substrate 1, so that the inter-layer insulator 6 covers the floating gate electrodes 5, wherein the inter-layer insulator 6 comprises laminations of a silicon oxide film, a silicon nitride film and a silicon oxide film. Control gate electrodes 7 are formed over the substrate 1 so that the control gate electrodes 7 are stripe shaped and extend in a second direction perpendicular to the first direction along which the trench isolations 3 extend. The control gate electrodes 7 comprises laminations of a polysilicon layer 7a and a tungsten silicide layer 7b on the polysilicon layer 7a.

Figure 15A:
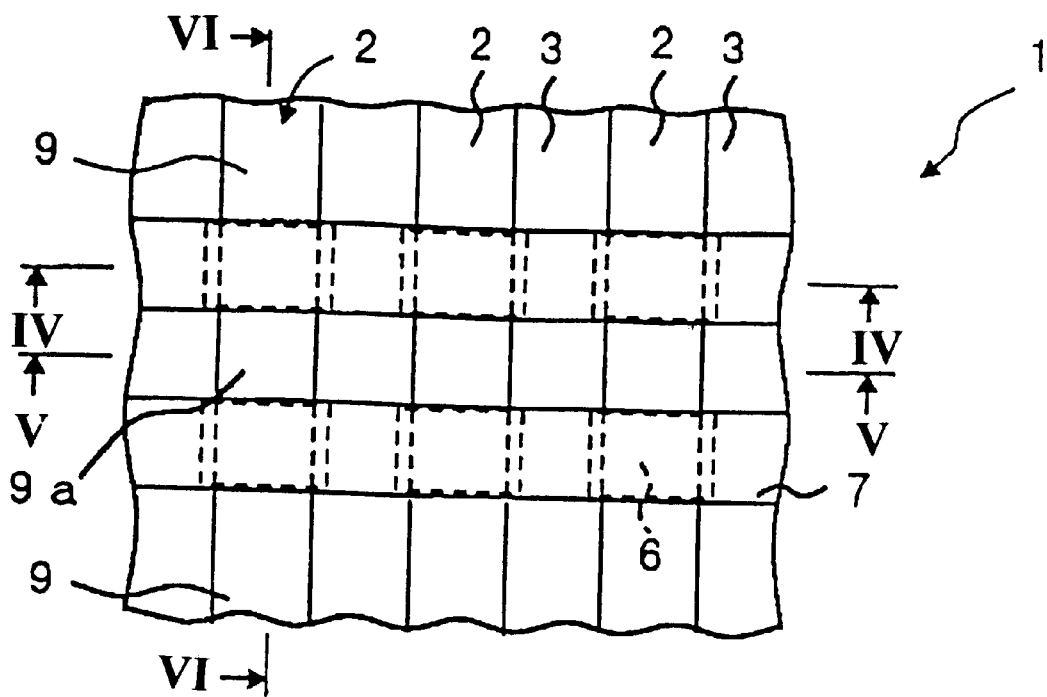
FIG. 15A is a fragmentary plane view illustrative of a semiconductor memory device having a trench isolation structure in a fourth step involved in a novel fabrication method in a second embodiment in accordance with the present invention.
Figure 15B:
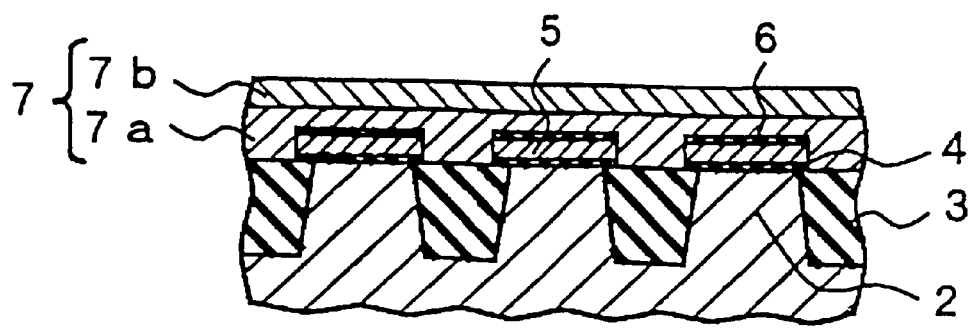
FIG. 15B is a fragmentary cross sectional elevation view illustrative of a semiconductor memory device having a trench isolation structure in a fourth step involved in a novel fabrication method, taken along an IV—IV line of FIG. 15A.
Figure 15C:
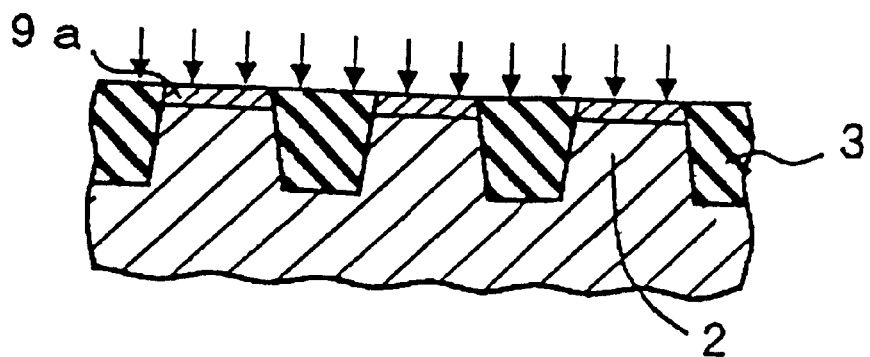
FIG. 15C is a fragmentary cross sectional elevation view illustrative of a semiconductor memory device having a trench isolation structure in a fourth step involved in a novel fabrication method, taken along a V—V line of FIG. 15A.
Figure 15D:
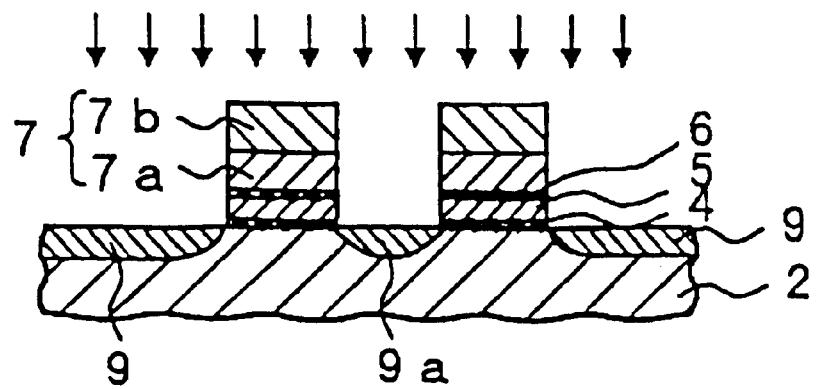
FIG. 15D is a fragmentary cross sectional elevation view illustrative of a semiconductor memory device having a trench isolation structure in a fourth step involved in a novel fabrication method, taken along an VI—VI line of FIG. 15A.

FIG. 15A is a fragmentary plane view illustrative of a semiconductor memory device having a trench isolation structure in a fourth step involved in a novel fabrication method in a second embodiment in accordance with the present invention. FIG. 15B is a fragmentary cross sectional elevation view illustrative of a semiconductor memory device having a trench isolation structure in a fourth step involved in a novel fabrication method, taken along an IV—IV line of FIG. 15A. FIG. 15C is a fragmentary cross sectional elevation view illustrative of a semiconductor memory device having a trench isolation structure in a fourth step involved in a novel fabrication method, taken along a V—V line of FIG. 15A. FIG. 15D is a fragmentary cross sectional elevation view illustrative of a semiconductor memory device having a trench isolation structure in a fourth step involved in a novel fabrication method, taken along an VI—VI line of FIG. 15A.

An ion-implantation of an impurity such as arsenic is carried out by using the control gate electrodes 7 as a mask in a vertical direction to the surface of the substrate to form source and drain diffusion layers 9. A silicon oxide film or a silicon nitride film is grown on an entire surface of the substrate 1 for subsequent etch back to the silicon oxide film so as to form side wall insulation films 10 on both side walls of the control gate electrodes 7.

Figure 16A:
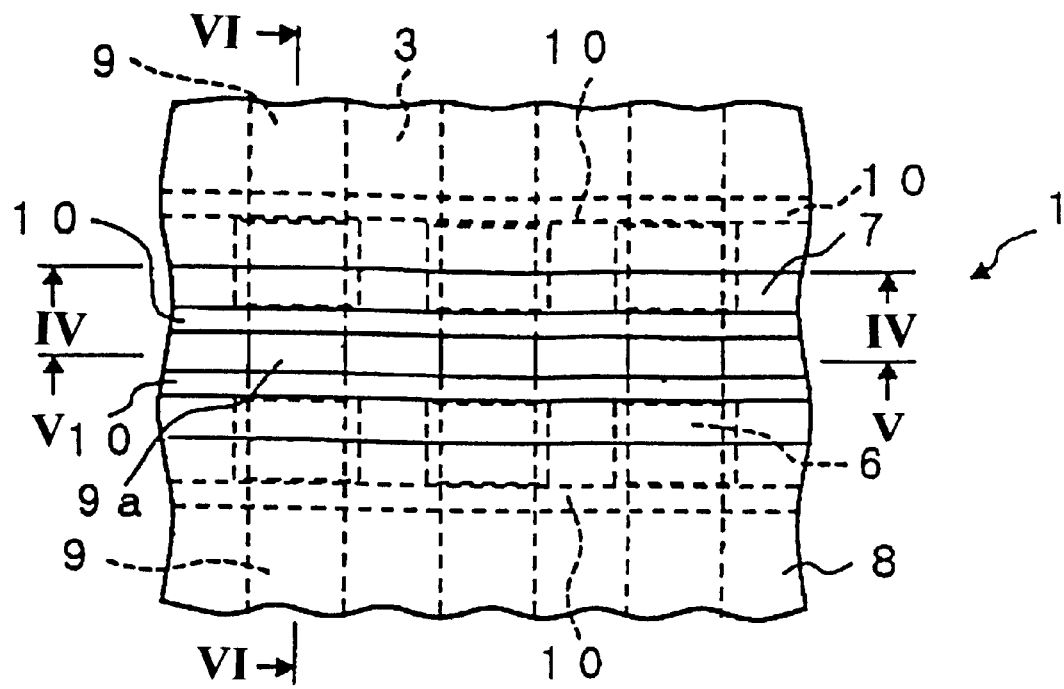
FIG. 16A is a fragmentary plane view illustrative of a semiconductor memory device having a trench isolation structure in a fifth step involved in a novel fabrication method in a second embodiment in accordance with the present invention.
Figure 16B:
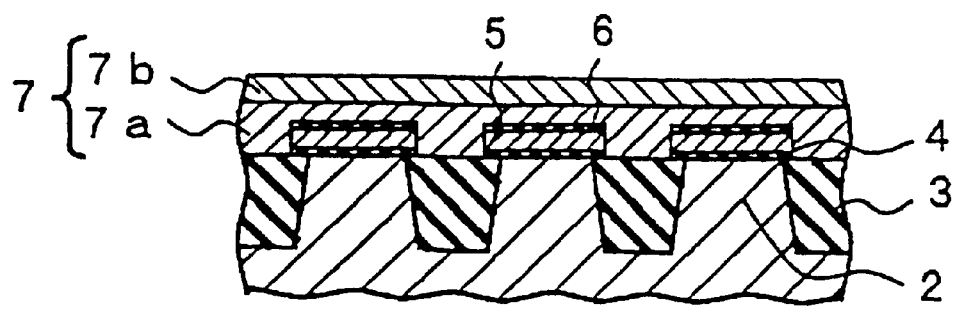
FIG. 16B is a fragmentary cross sectional elevation view illustrative of a semiconductor memory device having a trench isolation structure in a fifth step involved in a novel fabrication method, taken along an IV—IV line of FIG. 16A.
Figure 16C:
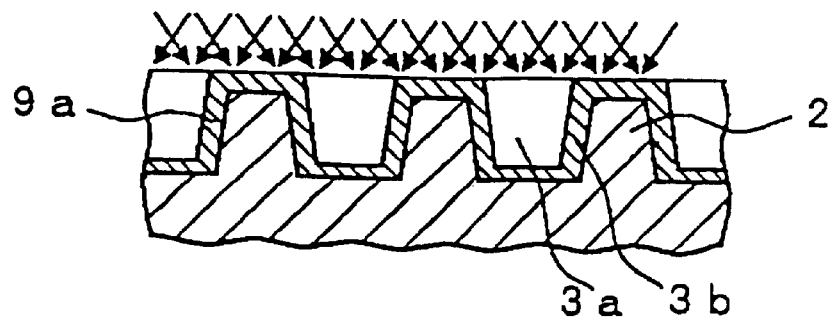
FIG. 16C is a fragmentary cross sectional elevation view illustrative of a semiconductor memory device having a trench isolation structure in a fifth step involved in a novel fabrication method, taken along a V—V line of FIG. 16A.
Figure 16D:
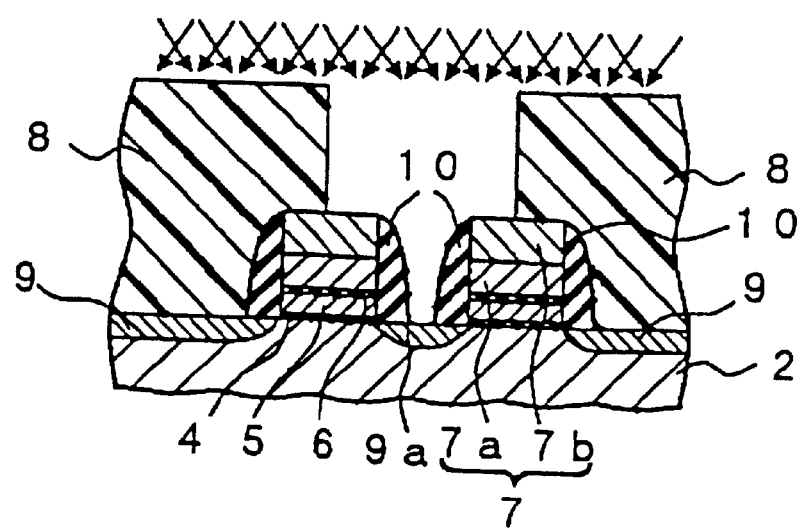
FIG. 16D is a fragmentary cross sectional elevation view illustrative of a semiconductor memory device having a trench isolation structure in a fifth step involved in a novel fabrication method, taken along an VI—VI line of FIG. 16A.

FIG. 16A is a fragmentary plane view illustrative of a semiconductor memory device having a trench isolation structure in a fifth step involved in a novel fabrication method in a second embodiment in accordance with the present invention. FIG. 16B is a fragmentary cross sectional elevation view illustrative of a semiconductor memory device having a trench isolation structure in a fifth step involved in a novel fabrication method, taken along an IV—IV line of FIG. 16A. FIG. 16C is a fragmentary cross sectional elevation view illustrative of a semiconductor memory device having a trench isolation structure in a fifth step involved in a novel fabrication method, taken along a V—V line of FIG. 16A. FIG. 16D is a fragmentary cross sectional elevation view illustrative of a semiconductor memory device having a trench isolation structure in a fifth step involved in a novel fabrication method, taken along an VI—VI line of FIG. 16A.

A photo-resist pattern 8 is selectively formed which has an opening which is positioned over a gap between the adjacent two of the control gate electrode 7 and also over confronting half sides of the adjacent two of the control gate electrode 7. The trench isolations 3 are selectively etched by use of the photo-resist pattern 8 to form etched trench grooves 3a. The used photo-resist pattern 8 is removed. An ion-implantation of an impurity such as arsenic is carried out by use of the control gate electrodes 7, the side wall insulation films 10 as masks in an oblique direction with rotation of the substrate 1 so as to introduce a sufficient amount of the impurity into the side surfaces 3b of the etched trench grooves 3a whereby the source diffusion layer 9a is formed in the side surfaces 3b of the etched trench grooves 3a. The side wall oxide films 10 prevent introduction of the impurity into a channel region between the source and drain diffusion layers 9. As a result, a problem with a punch through can be prevented.

An isolation layer not illustrated is formed entirely over the substrate 1 for subsequent patterning the isolation layer to form a contact portion in the source and drain regions 9 whereby one section has one set of two floating gate electrodes 5 which sandwich the source diffusion layer 9a. A bit line layer is formed so that the contact portion is filled with the bit line layer whereby the trench isolation NOR flash memory cell is formed, where one contact of the bit line layer has two bits.

In accordance with the above novel method, after the trench isolations were removed to have formed the etched trench grooves 3a, then the ion-implantation is carried out in the oblique direction with rotation of the substrate so that the sufficient amount of the impurity can be introduced into the side surfaces 3b of the etched trench grooves 3a, thereby forming the diffusion layers can be formed on the side surfaces 3b of the etched trench grooves 3a. As a result, the resistance of the source diffusion layer 9a can be reduced. The side wall oxide films 10 prevent introduction of the impurity into a channel region between the source and drain diffusion layers 9. As a result, a problem with a punch through can be prevented.

As compared to the first embodiment, this novel method has a reduced number of the fabrication processes.

Third Embodiment

A third embodiment according to the present invention will be described in detail with reference to the drawings. A novel method of forming a semiconductor memory device is provided.

Figure 17A:
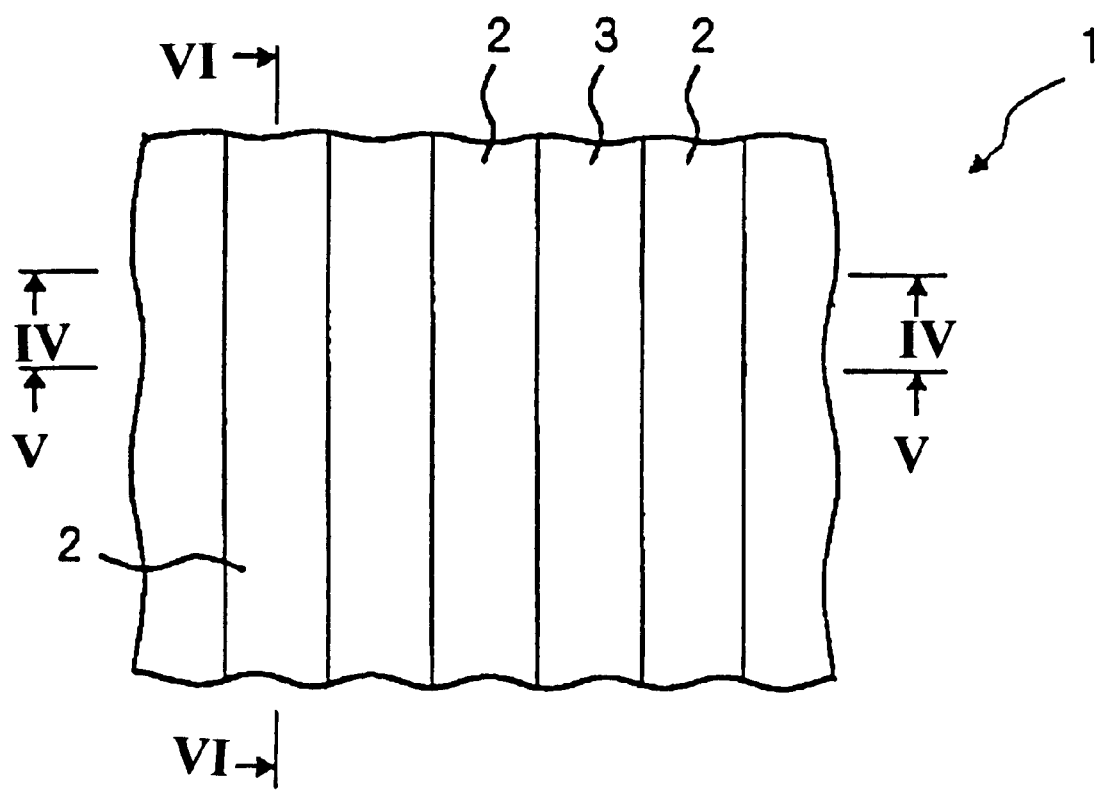
FIG. 17A is a fragmentary plane view illustrative of a semiconductor memory device having a trench isolation structure in a first step involved in a novel fabrication method in a third embodiment in accordance with the present invention.
Figure 17B:
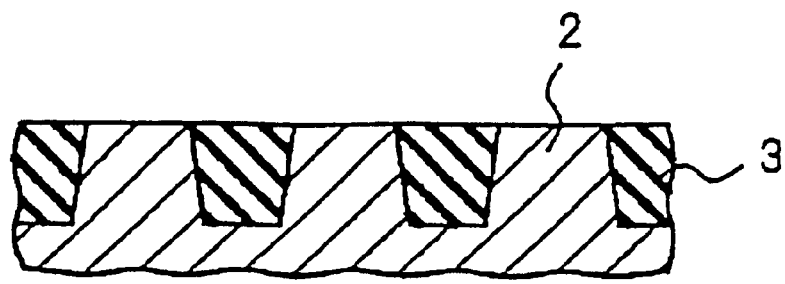
FIG. 17B is a fragmentary cross sectional elevation view illustrative of a semiconductor memory device having a trench isolation structure in a first step involved in a novel fabrication method, taken along an IV—IV line of FIG. 17A.
Figure 17C:
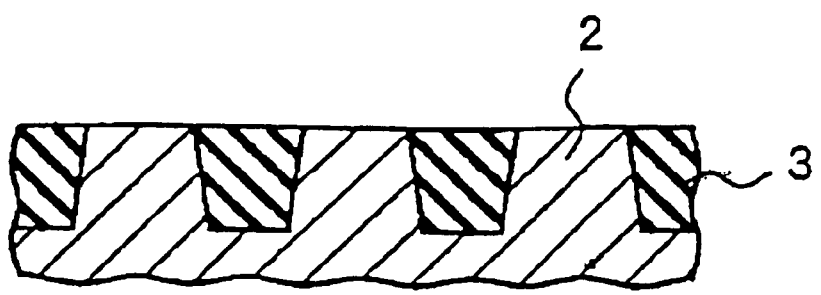
FIG. 17C is a fragmentary cross sectional elevation view illustrative of a semiconductor memory device having a trench isolation structure in a first step involved in a novel fabrication method, taken along a V—V line of FIG. 17A.
Figure 17D:
FIG. 17D is a fragmentary cross sectional elevation view illustrative of a semiconductor memory device having a trench isolation structure in a first step involved in a novel fabrication method, taken along an VI—VI line of FIG. 17A.

FIG. 17A is a fragmentary plane view illustrative of a semiconductor memory device having a trench isolation structure in a first step involved in a novel fabrication method in a third embodiment in accordance with the present invention. FIG. 17B is a fragmentary cross sectional elevation view illustrative of a semiconductor memory device having a trench isolation structure in a first step involved in a novel fabrication method, taken along an IV—IV line of FIG. 17A. FIG. 17C is a fragmentary cross sectional elevation view illustrative of a semiconductor memory device having a trench isolation structure in a first step involved in a novel fabrication method, taken along a V—V line of FIG. 17A. FIG. 17D is a fragmentary cross sectional elevation view illustrative of a semiconductor memory device having a trench isolation structure in a first step involved in a novel fabrication method, taken along an VI—VI line of FIG. 17A.

The semiconductor memory device in this embodiment is a trench isolation NOR fresh memory cell, wherein each contact of bit line layer has two bits.

With reference to FIGS. 17A, 17B, 17C and 17D, a reactive ion etching is used to form trench grooves in a surface region of a semiconductor substrate 1 thereby to define a plurality of diffusion layers 2 in the semiconductor substrate 1, wherein each of the trench grooves have a stripe shape in plane view and a trench shape in sectional view. The trench grooves extend in a first horizontal direction and in parallel to each other at a constant pitch. The trench grooves are filled with silicon oxide to form a plurality of trench isolations 3 in the trench grooves, wherein each of the diffusion layers 2 are defined between the adjacent two of the trench isolations 3. The trench isolations 3 have a stripe shape in plane view and a trench shape in sectional view. The trench isolations 3 extend in a first horizontal direction and in parallel to each other at a constant pitch.

Figure 18A:
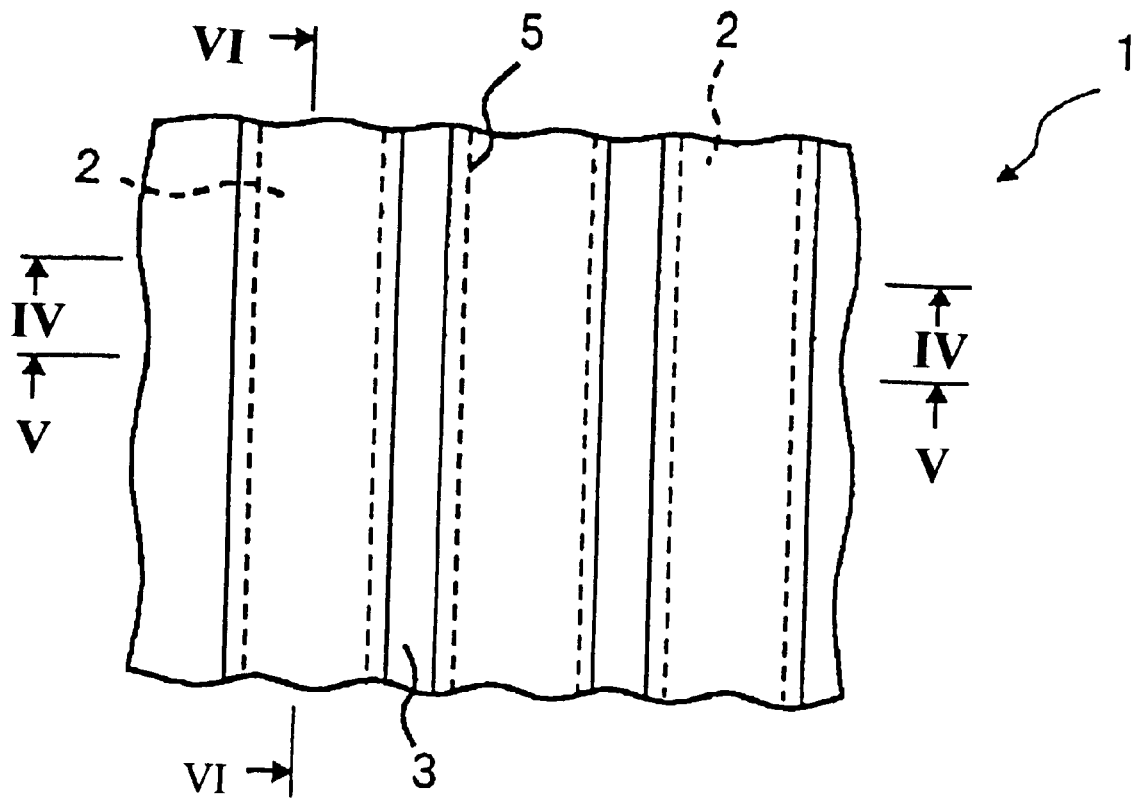
FIG. 18A is a fragmentary plane view illustrative of a semiconductor memory device having a trench isolation structure in a second step involved in a novel fabrication method in a third embodiment in accordance with the present invention.
Figure 18B:
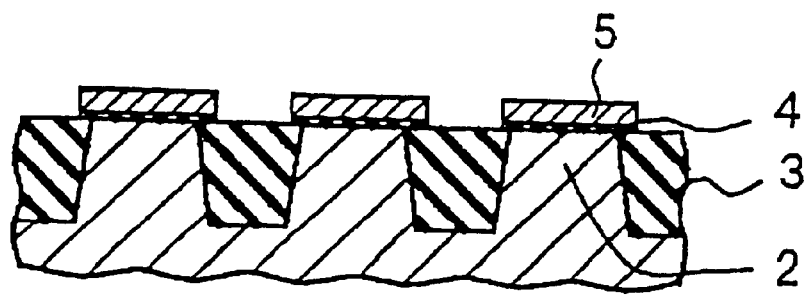
FIG. 18B is a fragmentary cross sectional elevation view illustrative of a semiconductor memory device having a trench isolation structure in a second step involved in a novel fabrication method, taken along an IV—IV line of FIG. 18A.
Figure 18C:
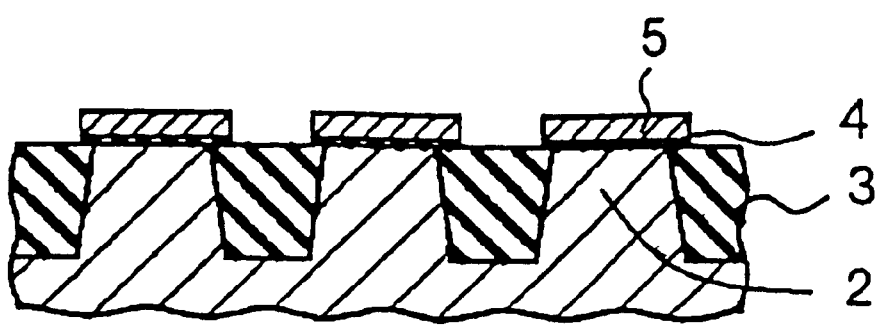
FIG. 18C is a fragmentary cross sectional elevation view illustrative of a semiconductor memory device having a trench isolation structure in a second step involved in a novel fabrication method, taken along a V—V line of FIG. 18A.
Figure 18D:
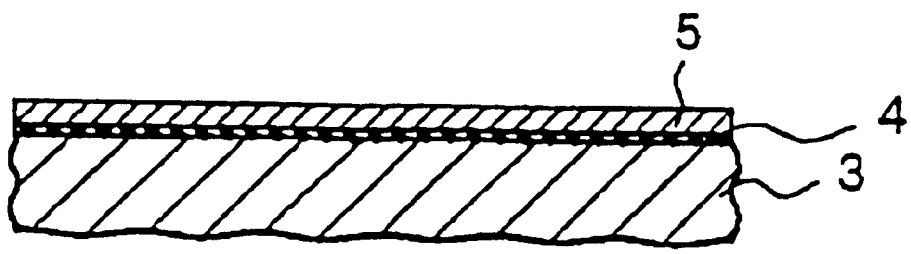
FIG. 18D is a fragmentary cross sectional elevation view illustrative of a semiconductor memory device having a trench isolation structure in a second step involved in a novel fabrication method, taken along an VI—VI line of FIG. 18A.

FIG. 18A is a fragmentary plane view illustrative of a semiconductor memory device having a trench isolation structure in a second step involved in a novel fabrication method in a third embodiment in accordance with the present invention. FIG. 18B is a fragmentary cross sectional elevation view illustrative of a semiconductor memory device having a trench isolation structure in a second step involved in a novel fabrication method, taken along an IV—IV line of FIG. 18A. FIG. 18C is a fragmentary cross sectional elevation view illustrative of a semiconductor memory device having a trench isolation structure in a second step involved in a novel fabrication method, taken along a V—V line of FIG. 18A. FIG. 18D is a fragmentary cross sectional elevation view illustrative of a semiconductor memory device having a trench isolation structure in a second step involved in a novel fabrication method, taken along an VI—VI line of FIG. 18A.

A gate insulation film is formed over surfaces of the diffusion layers 2. A floating gate electrode layer 5 is then formed on the gate insulation film. Laminations of the gate insulation film and the floating gate electrode layer are patterned to form gate insulation films 4 which cover the diffusion layers 2 and the floating gate electrodes 5 on the gate insulation films 4. The floating gate electrodes 5 extend in the first horizontal direction and in parallel to each other at the constant pitch.

Figure 19A:
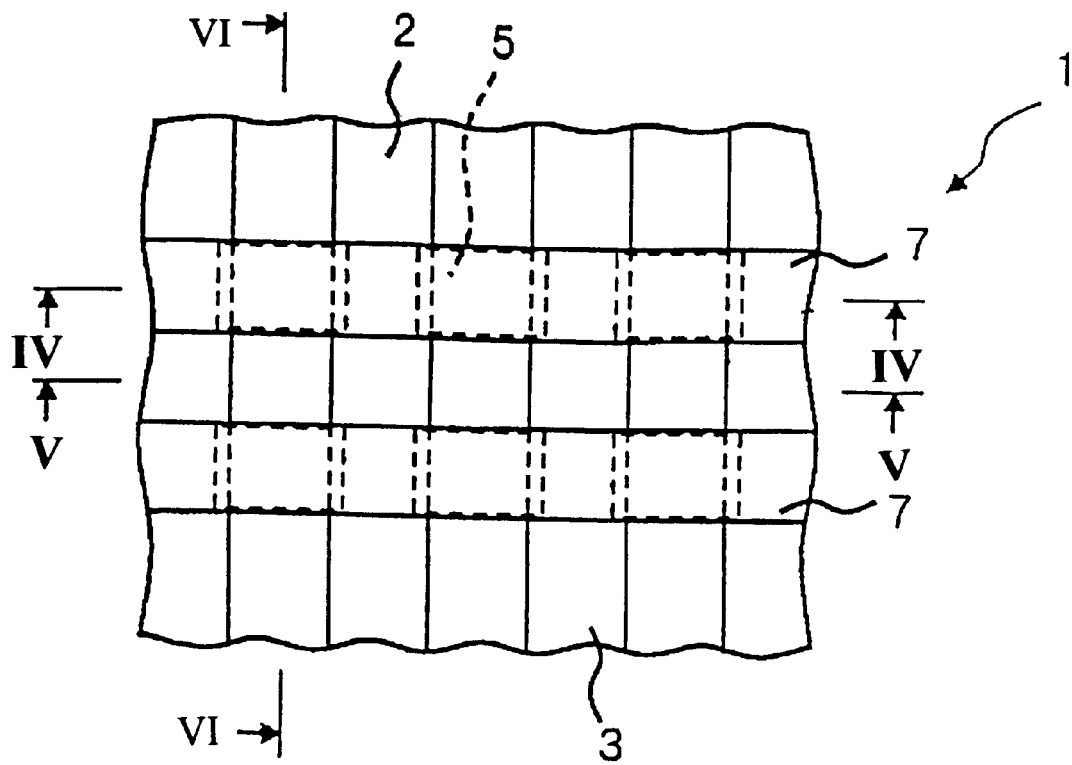
FIG. 19A is a fragmentary plane view illustrative of a semiconductor memory device having a trench isolation structure in a third step involved in a novel fabrication method in a third embodiment in accordance with the present invention.
Figure 19B:
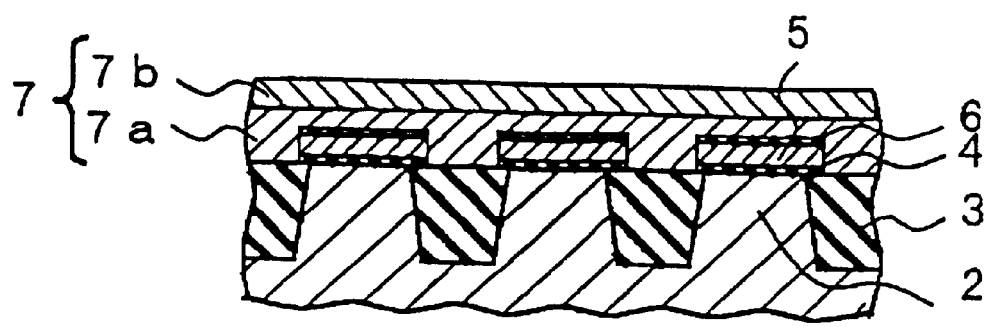
FIG. 19B is a fragmentary cross sectional elevation view illustrative of a semiconductor memory device having a trench isolation structure in a third step involved in a novel fabrication method, taken along an IV—IV line of FIG. 19A.
Figure 19C:
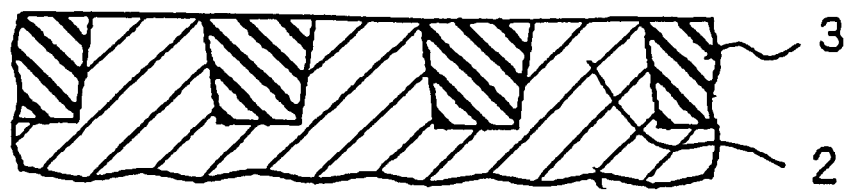
FIG. 19C is a fragmentary cross sectional elevation view illustrative of a semiconductor memory device having a trench isolation structure in a third step involved in a novel fabrication method, taken along a V—V line of FIG. 19A.
Figure 19D:
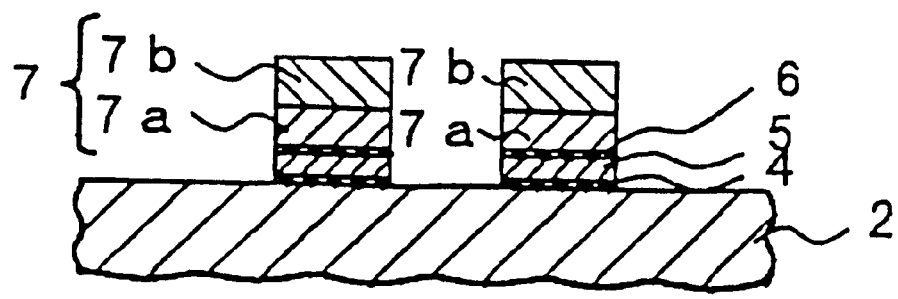
FIG. 19D is a fragmentary cross sectional elevation view illustrative of a semiconductor memory device having a trench isolation structure in a third step involved in a novel fabrication method, taken along an VI—VI line of FIG. 19A.

FIG. 19A is a fragmentary plane view illustrative of a semiconductor memory device having a trench isolation structure in a third step involved in a novel fabrication method in a third embodiment in accordance with the present invention. FIG. 19B is a fragmentary cross sectional elevation view illustrative of a semiconductor memory device having a trench isolation structure in a third step involved in a novel fabrication method, taken along an IV—IV line of FIG. 19A. FIG. 19C is a fragmentary cross sectional elevation view illustrative of a semiconductor memory device having a trench isolation structure in a third step involved in a novel fabrication method, taken along a V—V line of FIG. 19A. FIG. 19D is a fragmentary cross sectional elevation view illustrative of a semiconductor memory device having a trench isolation structure in a third step involved in a novel fabrication method, taken along an VI—VI line of FIG. 19A.

An inter-layer insulator 6 is formed over the substrate 1, so that the inter-layer insulator 6 covers the floating gate electrodes 5, wherein the inter-layer insulator 6 comprises laminations of a silicon oxide film, a silicon nitride film and a silicon oxide film. Control gate electrodes 7 are formed over the substrate 1 so that the control gate electrodes 7 are stripe shaped and extend in a second direction perpendicular to the first direction along which the trench isolations 3 extend. The control gate electrodes 7 comprises laminations of a polysilicon layer 7a and a tungsten silicide layer 7b on the polysilicon layer 7a.

Figure 20A:
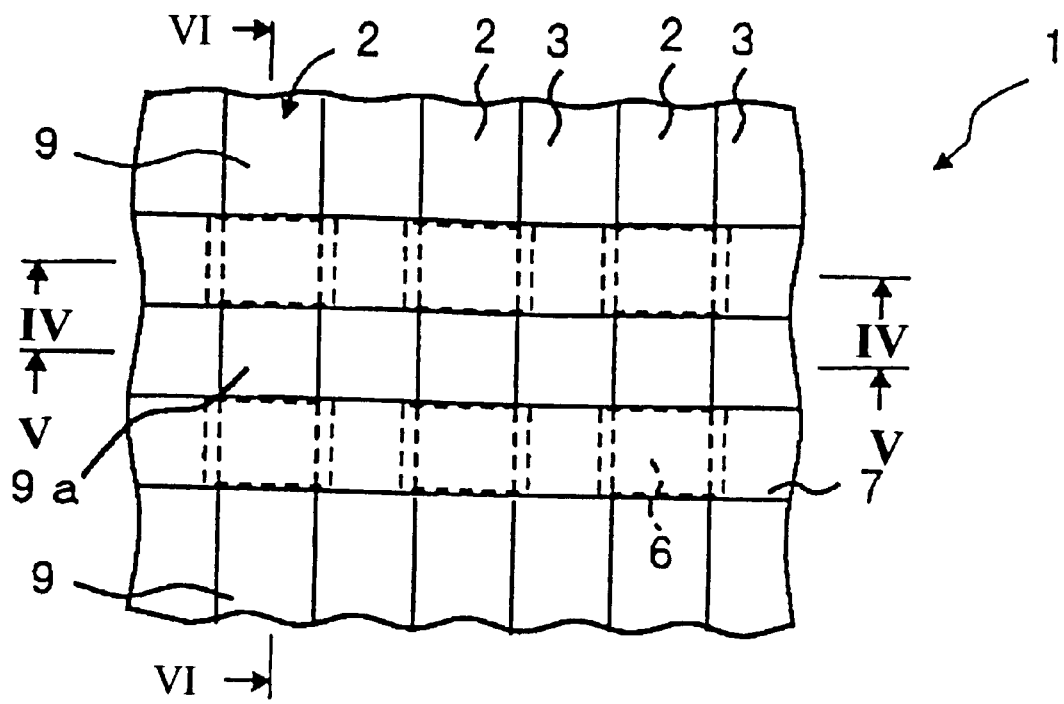
FIG. 20A is a fragmentary plane view illustrative of a semiconductor memory device having a trench isolation structure in a fourth step involved in a novel fabrication method in a third embodiment in accordance with the present invention.
Figure 20B:
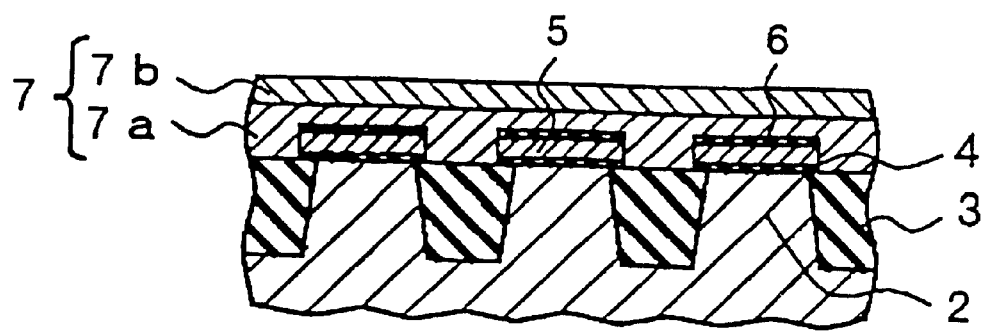
FIG. 20B is a fragmentary cross sectional elevation view illustrative of a semiconductor memory device having a trench isolation structure in a fourth step involved in a novel fabrication method, taken along an IV—IV line of FIG. 20A.
Figure 20C:
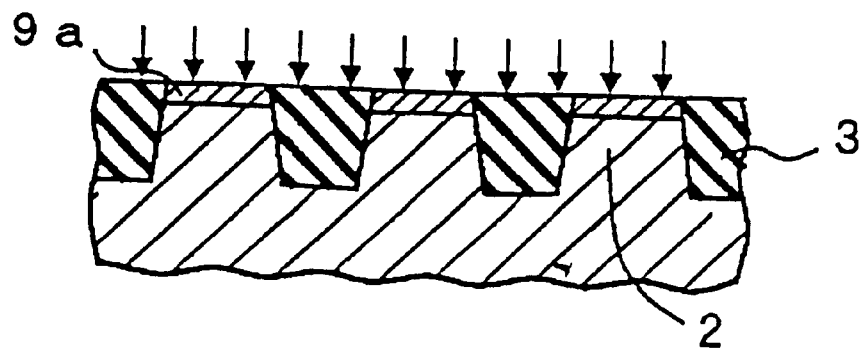
FIG. 20C is a fragmentary cross sectional elevation view illustrative of a semiconductor memory device having a trench isolation structure in a fourth step involved in a novel fabrication method, taken along a V—V line of FIG. 20A.
Figure 20D:
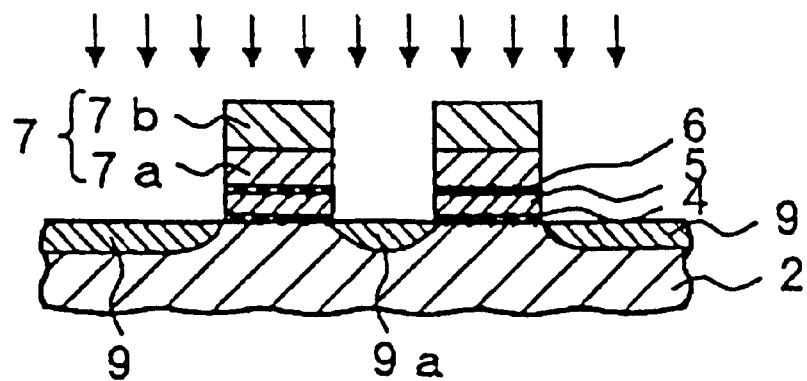
FIG. 20D is a fragmentary cross sectional elevation view illustrative of a semiconductor memory device having a trench isolation structure in a fourth step involved in a novel fabrication method, taken along an VI—VI line of FIG. 20A.

FIG. 20A is a fragmentary plane view illustrative of a semiconductor memory device having a trench isolation structure in a fourth step involved in a novel fabrication method in a third embodiment in accordance with the present invention. FIG. 20B is a fragmentary cross sectional elevation view illustrative of a semiconductor memory device having a trench isolation structure in a fourth step involved in a novel fabrication method, taken along an IV—IV line of FIG. 20A. FIG. 20C is a fragmentary cross sectional elevation view illustrative of a semiconductor memory device having a trench isolation structure in a fourth step involved in a novel fabrication method, taken along a V—V line of FIG. 20A. FIG. 20D is a fragmentary cross sectional elevation view illustrative of a semiconductor memory device having a trench isolation structure in a fourth step involved in a novel fabrication method, taken along an VI—VI line of FIG. 20A.

An ion-implantation of an impurity such as arsenic is carried out by using the control gate electrodes 7 as a mask in a vertical direction to the surface of the substrate to form source and drain diffusion layers 9. A silicon oxide film or a silicon nitride film is grown on an entire surface of the substrate 1 for subsequent etch back to the silicon oxide film so as to form first side wall insulation film 10b on a first side wall of the control gate electrodes 7 in side of the source diffusion layer 9a and second side wall insulation film 10c on a second side wall opposite to the first side wall, wherein the height of the first side wall insulation film 10b is higher than the height of the second side wall insulation film 10c.

Figure 21A:
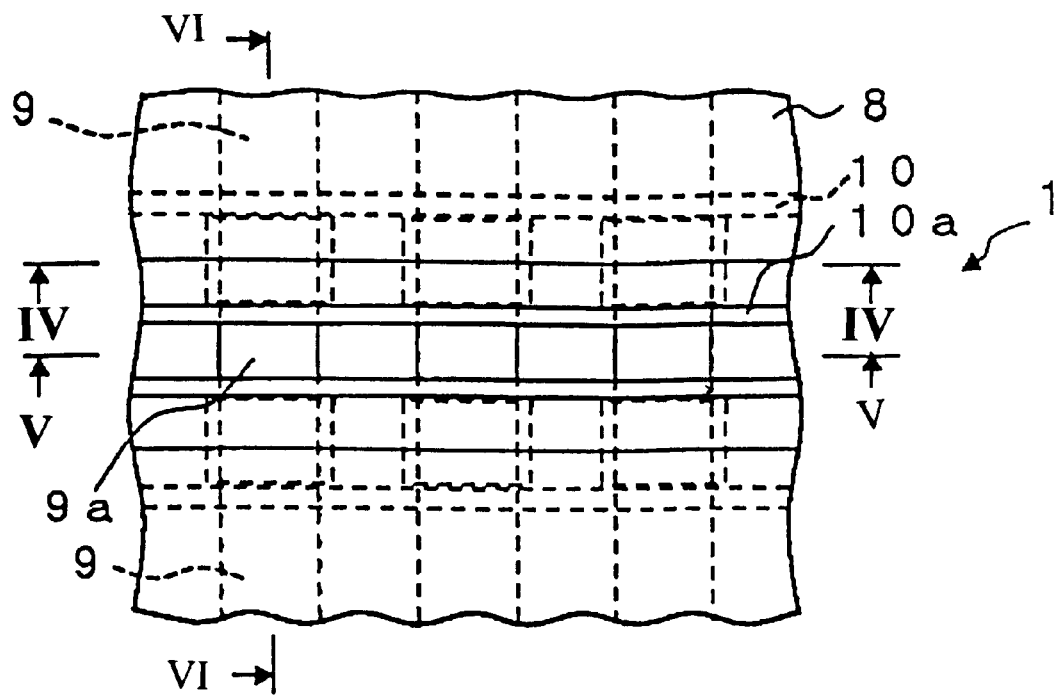
FIG. 21A is a fragmentary plane view illustrative of a semiconductor memory device having a trench isolation structure in a fifth step involved in a novel fabrication method in a third embodiment in accordance with the present invention.
Figure 21B:
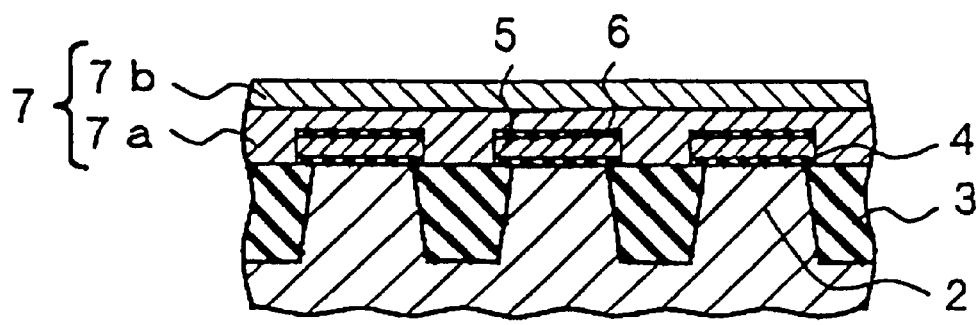
FIG. 21B is a fragmentary cross sectional elevation view illustrative of a semiconductor memory device having a trench isolation structure in a fifth step involved in a novel fabrication method, taken along an IV—IV line of FIG. 21A.
Figure 21C:
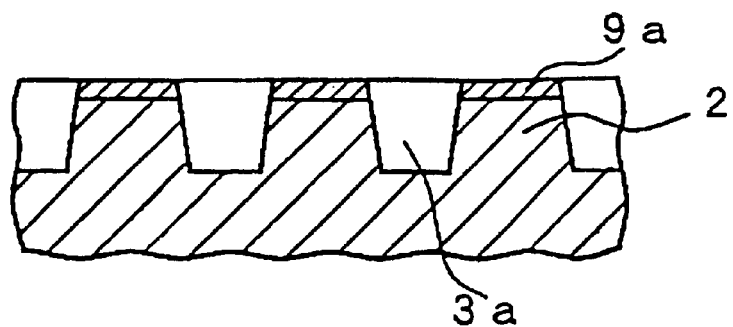
FIG. 21C is a fragmentary cross sectional elevation view illustrative of a semiconductor memory device having a trench isolation structure in a fifth step involved in a novel fabrication method, taken along a V—V line of FIG. 21A.
Figure 21D:
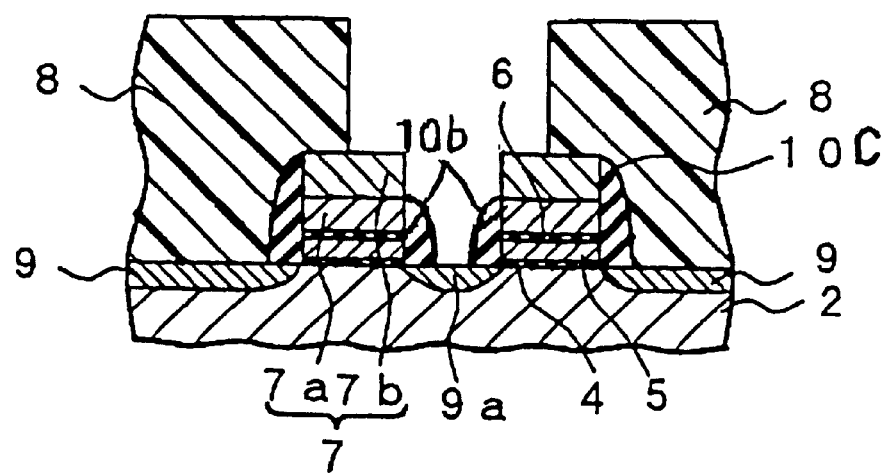
FIG. 21D is a fragmentary cross sectional elevation view illustrative of a semiconductor memory device having a trench isolation structure in a fifth step involved in a novel fabrication method, taken along an VI—VI line of FIG. 21A.

FIG. 21A is a fragmentary plane view illustrative of a semiconductor memory device having a trench isolation structure in a fifth step involved in a novel fabrication method in a third embodiment in accordance with the present invention. FIG. 21B is a fragmentary cross sectional elevation view illustrative of a semiconductor memory device having a trench isolation structure in a fifth step involved in a novel fabrication method, taken along an IV—IV line of FIG. 21A. FIG. 21C is a fragmentary cross sectional elevation view illustrative of a semiconductor memory device having a trench isolation structure in a fifth step involved in a novel fabrication method, taken along a V—V line of FIG. 21A. FIG. 21D is a fragmentary cross sectional elevation view illustrative of a semiconductor memory device having a trench isolation structure in a fifth step involved in a novel fabrication method, taken along an VI—VI line of FIG. 21A.

A photo-resist pattern 8 is selectively formed which has an opening which is positioned over a gap between the adjacent two of the control gate electrode 7 and also over confronting half sides of the adjacent two of the control gate electrode 7. The trench isolations 3 are selectively etched by use of the photo-resist pattern 8 to form etched trench grooves 3a. The used photo-resist pattern 8 is removed.

Figure 22A:
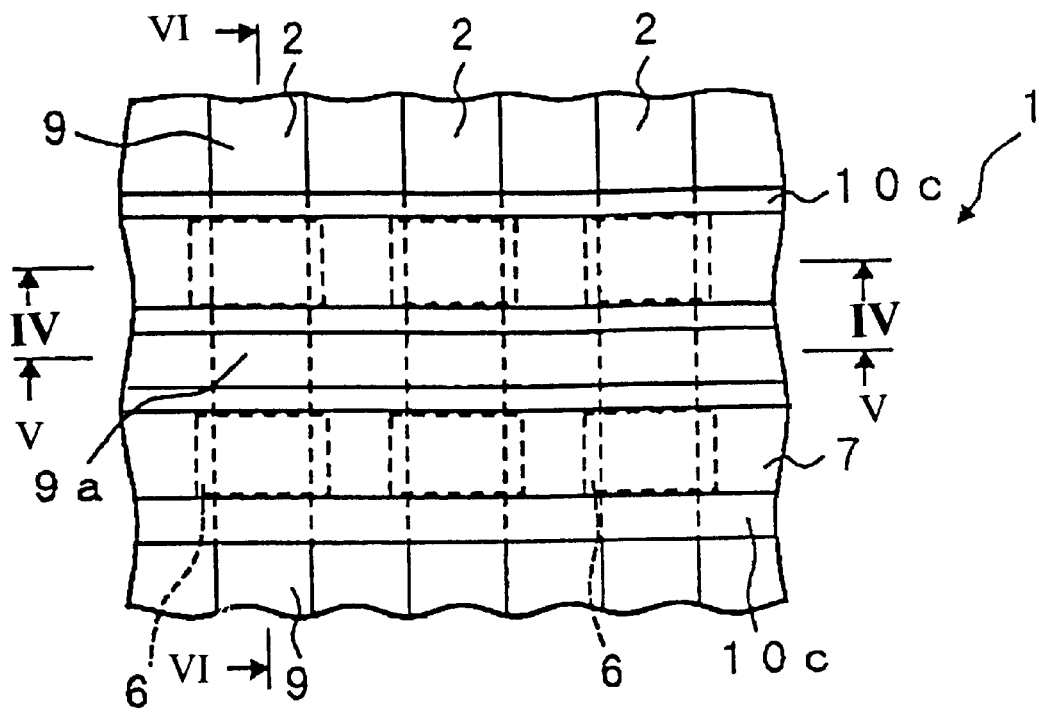
FIG. 22A is a fragmentary plane view illustrative of a semiconductor memory device having a trench isolation structure in a sixth step involved in a novel fabrication method in a third embodiment in accordance with the present invention.
Figure 22B:
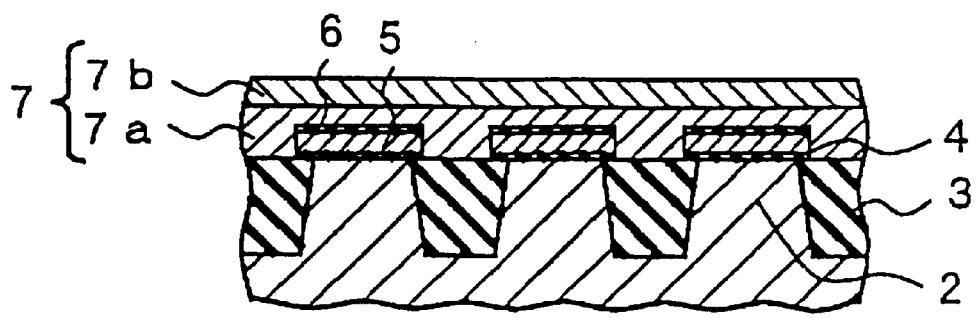
FIG. 22B is a fragmentary cross sectional elevation view illustrative of a semiconductor memory device having a trench isolation structure in a sixth step involved in a novel fabrication method, taken along an IV—IV line of FIG. 22A.
Figure 22C:
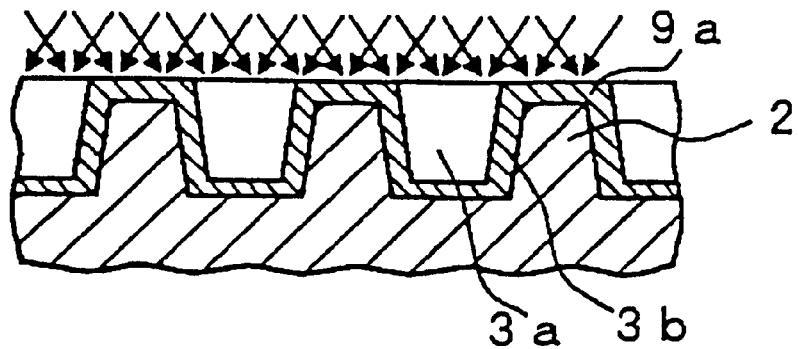
FIG. 22C is a fragmentary cross sectional elevation view illustrative of a semiconductor memory device having a trench isolation structure in a sixth step involved in a novel fabrication method, taken along a V—V line of FIG. 22A.
Figure 22D:
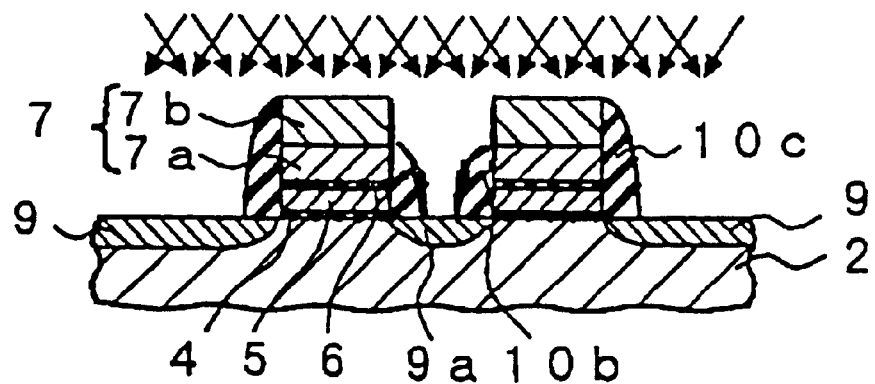
FIG. 22D is a fragmentary cross sectional elevation view illustrative of a semiconductor memory device having a trench isolation structure in a sixth step involved in a novel fabrication method, taken along an VI—VI line of FIG. 22A.

FIG. 22A is a fragmentary plane view illustrative of a semiconductor memory device having a trench isolation structure in a sixth step involved in a novel fabrication method in a third embodiment in accordance with the present invention. FIG. 22B is a fragmentary cross sectional elevation view illustrative of a semiconductor memory device having a trench isolation structure in a sixth step involved in a novel fabrication method, taken along an IV—IV line of FIG. 22A. FIG. 22C is a fragmentary cross sectional elevation view illustrative of a semiconductor memory device having a trench isolation structure in a sixth step involved in a novel fabrication method, taken along a V—V line of FIG. 22A. FIG. 22D is a fragmentary cross sectional elevation view illustrative of a semiconductor memory device having a trench isolation structure in a sixth step involved in a novel fabrication method, taken along an VI—VI line of FIG. 22A.

An ion-implantation of an impurity such as arsenic is carried out by use of the control gate electrodes 7, the first and second side wall insulation films 10b and 10c as masks in an oblique direction with rotation of the substrate 1 so as to introduce a sufficient amount of the impurity into the side surfaces 3b of the etched trench grooves 3a whereby the source diffusion layer 9a is formed in the side surfaces 3b of the etched trench grooves 3a. The first and second side wall oxide films 10b and 10c prevent introduction of the impurity into a channel region between the source and drain diffusion layers 9. As a result, a problem with a punch through can be prevented. The height of the second side wall oxide film 10c is lower than the height of the first side wall oxide film 10b, so that it is more easy to introduce the impurity into the source diffusion layers 9a as compared to when the first and second side wall oxide films have the same height as each other.

An isolation layer not illustrated is formed entirely over the substrate 1 for subsequent patterning the isolation layer to form a contact portion in the source and drain regions 9 whereby one section has one set of two floating gate electrodes 5 which sandwich the source diffusion layer 9a. A bit line layer is formed so that the contact portion is filled with the bit line layer whereby the trench isolation NOR flash memory cell is formed, where one contact of the bit line layer has two bits.

In accordance with the above novel method, after the trench isolations were removed to have formed the etched trench grooves 3a, then the ion-implantation is carried out in the oblique direction with rotation of the substrate so that the sufficient amount of the impurity can be introduced into the side surfaces 3b of the etched trench grooves 3a, thereby forming the diffusion layers can be formed on the side surfaces 3b of the etched trench grooves 3a. As a result, the resistance of the source diffusion layer 9a can be reduced. The side wall oxide films 10 prevent introduction of the impurity into a channel region between the source and drain diffusion layers 9. As a result, a problem with a punch through can be prevented.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of introducing impurity ions into side walls of a trench groove formed in a substrate, comprising:

forming gate electrode structures having side wall insulation films on said substrate; and implanting ions in an oblique direction while rotating said substrate and using said gate electrode structures and side wall insulation films as masks, wherein side wall insulation films on opposite sides of a gate electrode structure have different heights.

2. The method according to claim 1, wherein said trench grooves are separated by ridged portions of said substrate so that said trench grooves and said ridged portions are aligned between two gate electrode structures.

3. The method as claimed in claim 2, wherein said gate electrode structure comprises a floating gate electrode and a control gate electrode.

4. The method as claimed in claim 1, wherein said substrate is rotated about an axis perpendicular to a substrate surface.

5. The method as claimed in claim 1, wherein said ions are implanted into side walls of said trench grooves to form diffusion layers.

6. The method as claimed in claim 1, wherein said side wall insulation films prevent an introduction of impurity ions into a channel region between source and drain diffusion layers.

7. The method as claimed in claim 1, wherein said different heights of said side wall insulation films facilitate an implantation of impurity ions into source diffusion layers.

8. A method of forming a diffusion layer which extends on bottoms and side walls of trench grooves as well as on top portions of ridged portions separating said trench grooves, and said trench grooves being separated by ridged portions of a substrate so that said trench grooves and said ridged portions are aligned between two gate electrode structures, said method comprising:

carrying out a first ion-implantation in a vertical direction to introduce an impurity into said bottoms of said trench grooves and into top portions of said ridged portions by use of gate electrode structures as masks;

forming side wall insulation films on side walls of said gate electrode structures; and carrying out a second ion-implantation in an oblique direction while rotating said substrate and using said gate electrode structures and said side wall insulation films as masks, wherein side wall insulation films on opposite sides of a gate electrode structure have different heights.

9. The method as claimed in claim 8, wherein said gate electrode structure comprises a floating gate electrode and a control gate electrode.

10. A method of manufacturing a semiconductor device, comprising:

etching a substrate to form trench grooves and diffusion layers;

filling said trench grooves with silicon oxide to form trench isolations;

forming a gate insulating film and a floating gate electrode on said gate insulating film;

forming an interlayer insulating layer on said floating gate electrode;

forming control gate electrodes on said interlayer insulating layer;

vertically implanting impurity ions using said control gate electrodes as a mask, to form source and drain diffusion layers;

forming side wall insulation films on said gate electrode structures, wherein side wall insulation films on opposite sides of a gate electrode structure have different heights;

forming a photoresist pattern having an opening over a gap between two adjacent control gate electrodes and covering a portion of each of said two adjacent control gate electrodes;

etching said trench isolations using said photoresist as a mask, to form etched trench grooves; and implanting impurity ions at an angle oblique to a substrate surface using said control gate electrodes and said side wall insulation films as a mask and while rotating said semiconductor device, to form source diffusion layers in side walls of said etched trench grooves.

11. The method as claimed in claim 10, wherein said semiconductor device comprises a trench isolation memory cell.

* * * * *